(12) United States Patent
Kawai

(10) Patent No.: US 9,077,977 B2
(45) Date of Patent: Jul. 7, 2015

(54) IMAGE SENSOR AND IMAGING APPARATUS WITH SENSITIVITY VERSUS INCIDENT ANGLE RANGES FOR 2D AND 3D IMAGING

(71) Applicant: FUJIFILM Corporation, Tokyo (JP)

(72) Inventor: Tomoyuki Kawai, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/227,690

(22) Filed: Mar. 27, 2014

(65) Prior Publication Data

US 2014/0210952 A1   Jul. 31, 2014

Related U.S. Application Data

(63) Continuation of application No. PCT/JP2012/065363, filed on Jun. 15, 2012.

(30) Foreign Application Priority Data

Sep. 28, 2011   (JP) .................. 2011-213126

(51) Int. Cl.
*H04N 13/02*   (2006.01)
*H04N 5/369*   (2011.01)
*H04N 9/04*   (2006.01)
*H01L 27/146*   (2006.01)

(52) U.S. Cl.
CPC ......... *H04N 13/0207* (2013.01); *H04N 5/3696* (2013.01); *H04N 9/045* (2013.01); *H01L 27/14605* (2013.01); *H01L 27/14623* (2013.01); *H04N 13/0217* (2013.01); *H04N 13/0285* (2013.01); *H04N 13/0232* (2013.01); *H04N 13/0257* (2013.01); *H04N 13/0289* (2013.01)

(58) Field of Classification Search
CPC .......... H04N 13/0207; H04N 13/0285; H04N 13/0217
USPC .................................. 348/49, 46, 42
See application file for complete search history.

(56) References Cited

U.S. PATENT DOCUMENTS

| 6,522,356 B1* | 2/2003 | Watanabe ............. 348/272 |
| 8,330,848 B2 | 12/2012 | Yamamoto |
| 2009/0146046 A1 | 6/2009 | Katsuda et al. |

(Continued)

FOREIGN PATENT DOCUMENTS

| JP | 11-307751 A | 11/1999 |
| JP | 2003-7994 A | 1/2003 |

(Continued)

*Primary Examiner* — Jay Patel
*Assistant Examiner* — Francis G Geroleo
(74) *Attorney, Agent, or Firm* — Birch Stewart Kolasch & Birch, LLP

(57) ABSTRACT

An image sensor includes: a plurality of pixels arranged and formed in a two-dimensional array so that adjacent ones of the pixels constitute paired pixels and entrance pupils of a first pixel and a second pixel constituting the paired pixels are provided eccentrically in opposite directions to each other with respect to centers of the respective pixels; an incident angle of light from a subject in the first pixel is an incident angle θcA as defined herein; the incident angle in the second pixel is an incident angle −θcB as defined herein; and light sensitivity characteristics of the first pixel and the second pixel with respect to the incident angles of the first pixel and the second pixel are flat characteristics within an incident angle range of the θcA to the −θcB.

14 Claims, 28 Drawing Sheets

(56) References Cited

U.S. PATENT DOCUMENTS

| | | |
|---|---|---|
| 2009/0189236 A1 | 7/2009 | Hayashi et al. |
| 2009/0230494 A1 | 9/2009 | Takizawa |
| 2010/0283863 A1 | 11/2010 | Yamamoto |
| 2011/0037732 A1* | 2/2011 | Takama et al. ............... 345/175 |
| 2013/0038691 A1* | 2/2013 | Agranov et al. ............... 348/46 |
| 2013/0107017 A1* | 5/2013 | Endo ............................... 348/49 |
| 2013/0215238 A1* | 8/2013 | Yamazaki ....................... 348/49 |

FOREIGN PATENT DOCUMENTS

| | | | |
|---|---|---|---|
| JP | 2007124137 A | * | 5/2007 |
| JP | 2007-279512 A | | 10/2007 |
| JP | 2009-145401 A | | 7/2009 |
| JP | 2009-218382 A | | 9/2009 |
| JP | 2010-135844 A | | 6/2010 |
| JP | 2010-263572 A | | 11/2010 |

* cited by examiner

FIG. 14

| F-NUMBER | MINIMUM θlr [DEGREE] | MAXIMUM θlr [DEGREE] |
|---|---|---|
| 3.5 | -8.13 | 8.13 |
| 3 | -9.46 | 9.46 |
| 2.8 | -10.12 | 10.12 |
| 2.4 | -11.77 | 11.77 |
| 2 | -14.04 | 14.04 |
| 1.8 | -15.52 | 15.52 |
| 1.4 | -19.65 | 19.65 |

FIG. 16

| F-NUMBER | MINIMUM θ_Amax [DEGREE] | MAXIMUM θ_Bmax [DEGREE] |
|---|---|---|
| 3.5 | -8.13 | 8.13 |
| 3 | -9.46 | 9.46 |
| 2.8 | -10.12 | 10.12 |
| 2.4 | -11.77 | 11.77 |
| 2 | -14.04 | 14.04 |
| 1.8 | -15.52 | 15.52 |
| 1.4 | -19.65 | 19.65 |

FIG. 18

| F-NUMBER | MINIMUM θll [DEGREE] | MAXIMUM θrr [DEGREE] |
|---|---|---|
| 3.5 | -8.13 | 8.13 |
| 3 | -9.46 | 9.46 |
| 2.8 | -10.12 | 10.12 |
| 2.4 | -11.77 | 11.77 |
| 2 | -14.04 | 14.04 |
| 1.8 | -15.52 | 15.52 |
| 1.4 | -19.65 | 19.65 |

FIG. 20

| F-NUMBER | MINIMUM θc [DEGREE] |
|---|---|
| 5.6 | 5.10 |
| 7 | 4.09 |
| 8 | 3.58 |
| 11 | 2.60 |

FIG. 23

| CONDITION | F-NUMBER | SENSOR INCIDENT ANGLE |
|---|---|---|
| OPEN | 1.2 | 22.62 |
| CHANGE TO 3D | 2.2 | 12.80 |
| CHANGE TO 2D | 7.2 | 3.97 |
| SMALL-DIAPHRAGM | 11.0 | 2.60 |

IMAGE SENSOR AND IMAGING APPARATUS WITH SENSITIVITY VERSUS INCIDENT ANGLE RANGES FOR 2D AND 3D IMAGING

CROSS REFERENCE TO RELATED APPLICATION

This is a continuation of International Application No. PCT/JP2012/065363 filed on Jun. 15, 2012, and claims priority from Japanese Patent Application No. 2011-213126 filed on Sep. 28, 2011, the entire disclosures of which are incorporated herein by reference.

TECHNICAL FIELD

The present invention relates to an image sensor for monocular 3D imaging and an imaging apparatus mounted with the image sensor. Particularly, it relates to an image sensor and an imaging apparatus which can take not only a 3D image (stereoscopic image) but also a high-definition 2D image (plane image).

BACKGROUND ART

Various image sensors capable of taking a 3D image of a subject with a monocular system have been proposed as disclosed in the following Patent Literatures 1, 2 and 3.

In an image sensor capable of taking a 3D image, for example, as shown in FIG. 27, a plurality of pixels arranged and formed in a two-dimensional array are divided into paired pixels 2 which are pairs of two adjacent pixels. Of each pair of the pixels, one pixel is provided with a light shielding film opening 2a made eccentric, for example, on the horizontal right side with respect to its pixel center, while the other pixel is provided with a light shielding film opening 2b made eccentric on the horizontally opposite side, that is, on the horizontally left side with respect to its pixel center.

The light shielding film opening 2a is eccentric on the right side so that incident light with which a right eye views a subject can be incident thereon. The light shielding film opening 2b is eccentric on the right side so that incident light with which a left eye views the subject can be incident thereon. Thus, an image taken by the pixels each having the light shielding film opening 2a is used as a right eye image and an image taken by the pixels each having the light shielding film opening 2b is used as a left eye image, so that a stereoscopic image (3D image) of the subject can be reproduced.

FIG. 28 is a graph showing sensitivities and incident angle dependencies of the paired pixels in FIG. 27. Here, zero degree in FIG. 28 designates an incident angle of zero degree, that is, an angle of incident light which is incident perpendicularly on the light receiving surface of a pixel. A plus side incident angle designates an incident angle from the direction of the light shielding film opening 2a which is made eccentric on the right side with respect to the pixel center. A minus side incident angle designates an incident angle from the direction of the light shielding film opening 2b which is made eccentric on the left side with respect to the pixel center. Sensitivity curves I and II of the pixels having the light shielding film openings 2a and 2b have incident angle dependencies respectively, and the difference in sensitivity between the paired pixels corresponds to a phase difference amount. As the ratio of the range (hatched range) where the two sensitivity curves I and II overlap each other to the total area is smaller, the phase difference amount between the two pixels increases. However, when the light shielding openings 2a and 2b are narrowed to reduce the overlapping range, the sensitivities become too low so that no image but a dark image can be taken. Therefore, the light shielding film openings 2a and 2b have to be set at suitable dimensions so that the light shielding film openings can be determined with suitable eccentricities.

Someone may want to take a 2D image of a subject even with an image sensor capable of taking a 3D image. When a 2D image is produced using detection signals of individual pixels of the image sensor shown in FIG. 27, the quality of the 2D image deteriorates due to a phase difference between a taken image signal of each pixel with the light shielding film opening 2a and a taken image signal of each pixel with the light shielding film opening 2b.

Therefore, when the taken image signals of two paired pixels are added to each other in order to cancel the phase difference amount, a high-quality 2D image can be obtained. Due to the addition of the pixels, however, the resolution is halved with respect to the number of pixels provided in the image sensor. Thus, there arises a problem that a high-definition 2D image cannot be taken.

CITATION LIST

Patent Literature

Patent Literature 1: JP-A-2010-263572
Patent Literature 2: JP-A-2003-7994
Patent Literature 3: JP-A-2007-279512

SUMMARY OF INVENTION

Technical Problem

An object of the invention is to provide an image sensor and an imaging apparatus capable of taking a high-definition 2D image even with the image sensor capable of taking a 3D image.

Solution to Problem

An image sensor according to the invention is an image sensor including: a plurality of pixels arranged and formed in a two-dimensional array so that adjacent ones of the pixels constitute paired pixels and entrance pupils of a first pixel and a second pixel constituting the paired pixels are provided eccentrically in opposite directions to each other with respect to centers of the respective pixels; characterized in that:

an incident angle of light from a subject in the first pixel is an incident angle θcA which is within a range between 0° corresponding to a normal direction of the pixels and an incident angle θmaxa at a maximum light sensitivity, and in which the light sensitivity of the first pixel is within a range of from 40% to 80% of the maximum light sensitivity;

the incident angle in the second pixel is an incident angle −θcB which is within a range between 0° corresponding to the normal direction of the pixels and an incident angle θmaxb at the maximum light sensitivity, and in which the light sensitivity of the second pixel is within a range of from 40% to 80% of the maximum light sensitivity; and light sensitivity characteristics of the first pixel and the second pixel with respect to the incident angles of the first pixel and the second pixel are flat characteristics within an incident angle range of from the θcA to the −θcB.

An imaging apparatus according to the invention is an imaging apparatus including: the aforementioned image sensor; and a diaphragm provided in a stage in front of the image sensor; characterized in that: the imaging apparatus further includes a control unit which reduces the diaphragm so that an incident angle range of incident light on the image sensor can be limited within a required angle range when a plane image is taken, and which opens the diaphragm so that incident light whose incident angle range is out of the required angle range can be made incident on the image sensor when a 3D image is taken.

Advantageous Effects of Invention

According to the invention, when a good and high-definition 2D image is taken, the incident angle range of incident light is limited to the aforementioned predetermined angle range so that the 2D image can be obtained.

BRIEF DESCRIPTION OF DRAWINGS

FIG. 14 A table showing the relationship between the converted F-number and the parameters θIr and θrI explained in FIG. 13.

FIG. 16 A table showing the relationship between the converted F-number and the parameters (maximum light sensitivities) explained in FIG. 15.

FIG. 18 A table showing the relationship between the converted F-number and the parameters θII and θrr explained in FIG. 17.

FIG. 20 A table showing the relationship between the converted F-number and the parameter θc explained in FIG. 19.

FIG. 23 A view for explaining an F-number switched between a 2D imaging mode and a 3D imaging mode in the specific examples of FIG. 22.

DESCRIPTION OF EMBODIMENTS

One embodiment of the invention will be described below with reference to the drawings.

Figure 1:
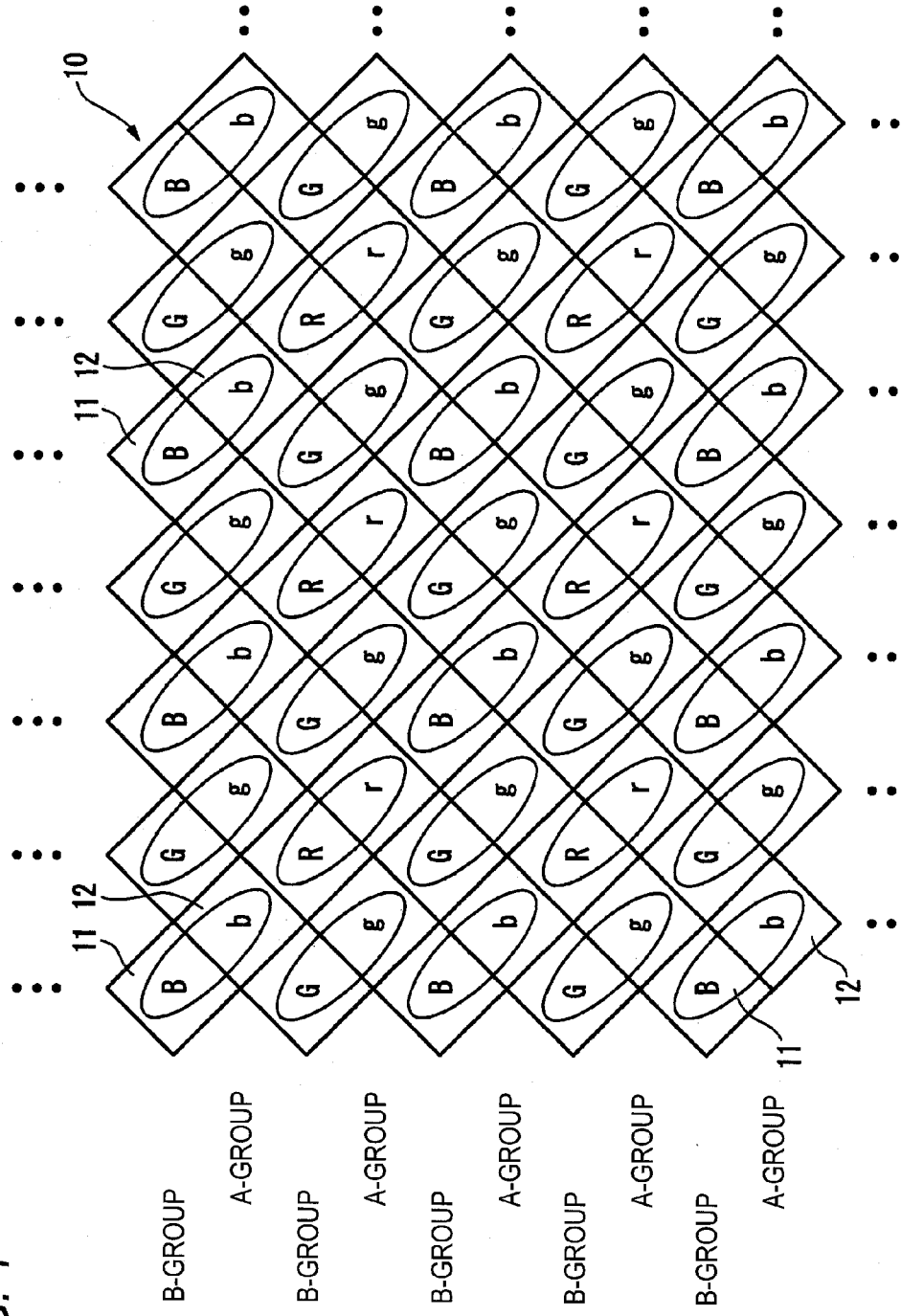
FIG. 1 A surface pattern view of an image sensor (imaging device) according to one embodiment of the invention.

FIG. 1 is a surface pattern diagram of an image sensor according to one embodiment of the invention. This image sensor 10 is constituted by a plurality of pixels (photodiodes: depicted as oblique squares) 11 and 12 arranged and formed in a two-dimensional array. In the illustrated example, the pixels in even numbered rows are shifted from the pixels in odd numbered rows by half a pixel pitch respectively.

In view of only first-group pixels (A-group pixels) consisting of pixels 12 in odd numbered rows (or even numbered rows), the pixels 12 are arranged in a square grating array, and color filters r (red), g (green) and b (blue) of three primary colors are arranged in a Bayer array on the respective pixels 12. In view of only second-group pixels 11 (B-group pixels) consisting of pixels in even numbered rows (or odd numbered rows), the pixels are arranged in a square grating array, and color filters R (red), G (green) and B (blue) of three primary colors are arranged in a Bayer array on the respective pixels 11. Though R=r, G=g and B=b, uppercase letters and lowercase letters are used in the illustration for identifying the A-group pixels and the B-group pixels.

An A-group pixel 12 and a B-group pixel 11 which are obliquely adjacent to each other and which have the same color are set as paired pixels. In FIG. 1, each pair of the pixels are enclosed by an oblique ellipse. A micro-lens is mounted on each pixel 11, 12, but it is not shown in FIG. 1 (see FIG. 4).

Figure 2:
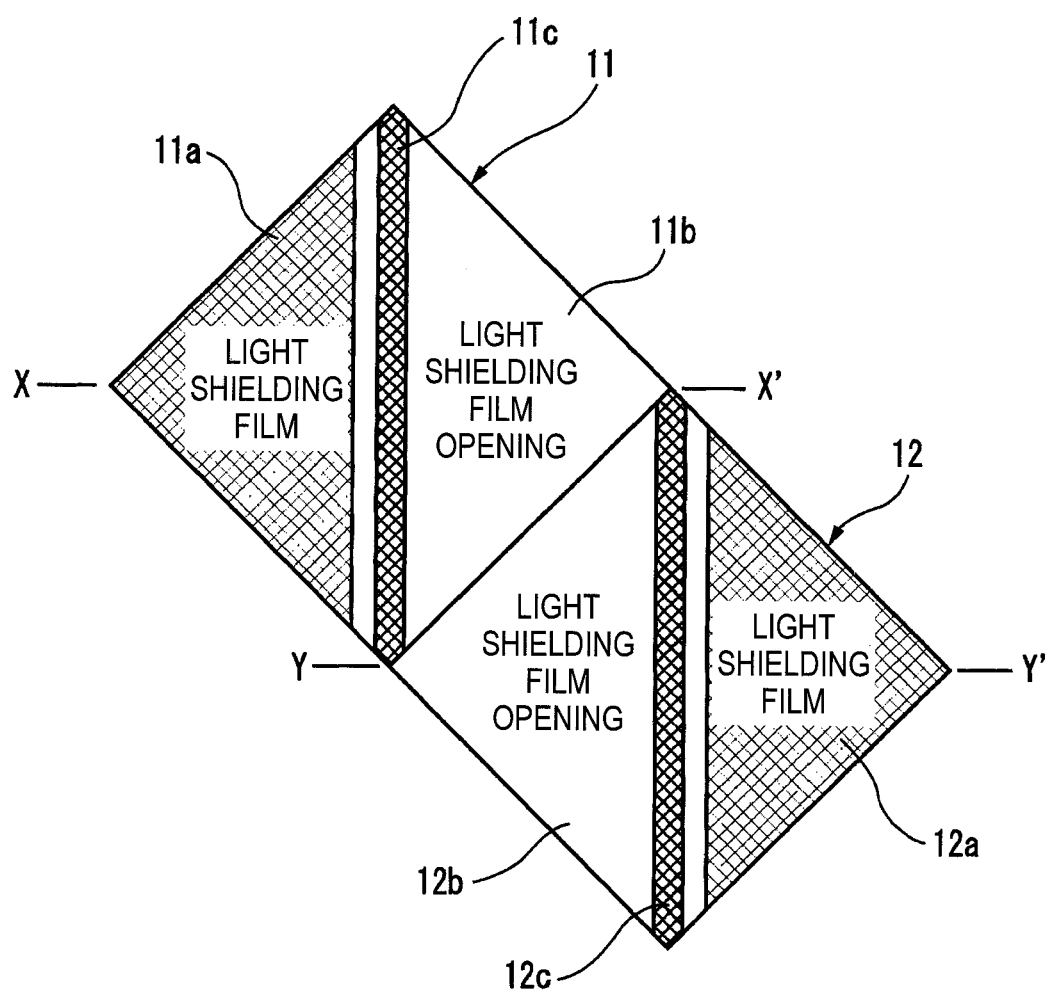
FIG. 2 A detailed planar pattern view of one pair of pixels in the image sensor shown in FIG. 1.

FIG. 2 is an enlarged view of one pair of pixels 11 and 12. In the pixel 11, a first light shielding film 11a shields light in the substantially left half part of the pixel 11, and a light shielding film opening 11b is provided in the substantially right half part of the pixel 11. Thus, the center of gravity in the light shielding film opening 11b is displaced to the right with respect to the center of gravity in the pixel 11.

In the pixel 12, a first light shielding film 12a shields light in the substantially right half part of the pixel 12, and a light shielding film opening 12b is provided in the substantially left half part of the pixel 12. Thus, the center of gravity in the light shielding film opening 12b is displaced to the left with respect to the center of gravity in the pixel 12.

Figure 3:
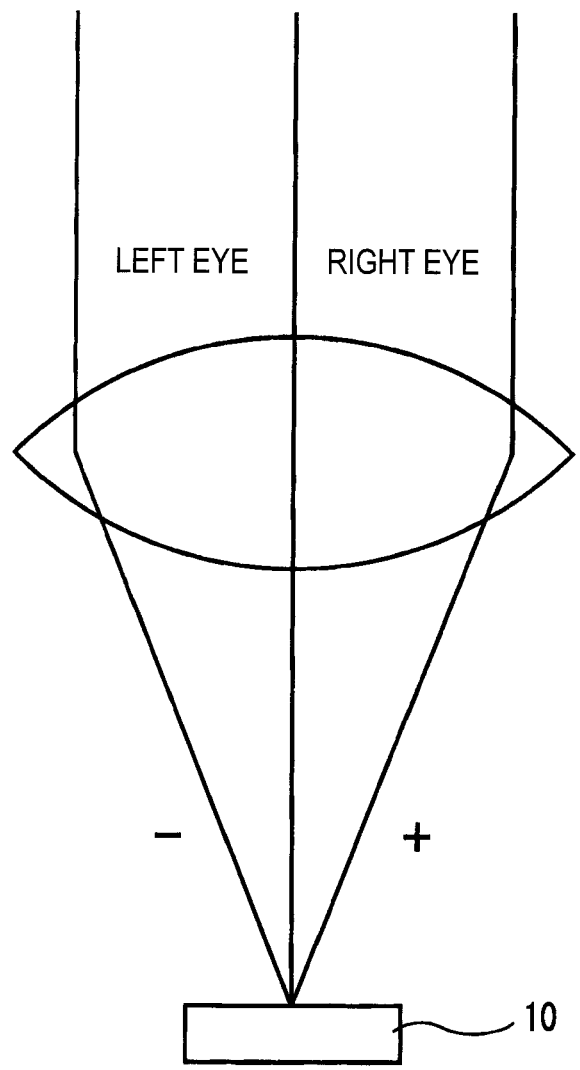
FIG. 3 A view showing incident light on the image sensor.

FIG. 3 is a view showing incident light from a subject onto the image sensor 10. As described with reference to FIG. 2, the light shielding film openings 11b and 12b of the pixels 11 and 12 are provided eccentrically in opposite directions to each other respectively so as to limit the entrance pupils of the pixels 11 and 12 respectively. Thus, the incident angle of light on each pixel 11, 12 is limited. As a result, light from the subject when viewed by a right eye is dominantly incident on the pixel 11, while light from the subject when viewed by a left eye is dominantly incident on the pixel 12.

Return to FIG. 2. Further, in this embodiment, a second light shielding film 11c, 12c which is narrow is provided in each pixel 11, 12 so as to extend in a center line connecting opposite corners of the pixel. A light receiving region of the image sensor is formed into a rectangle which is long horizontally, for example, with a ratio of 4:3 etc. With respect to the horizontal direction, each second light shielding film 11c, 12c having a linear shape is provided vertically.

Figure 4:
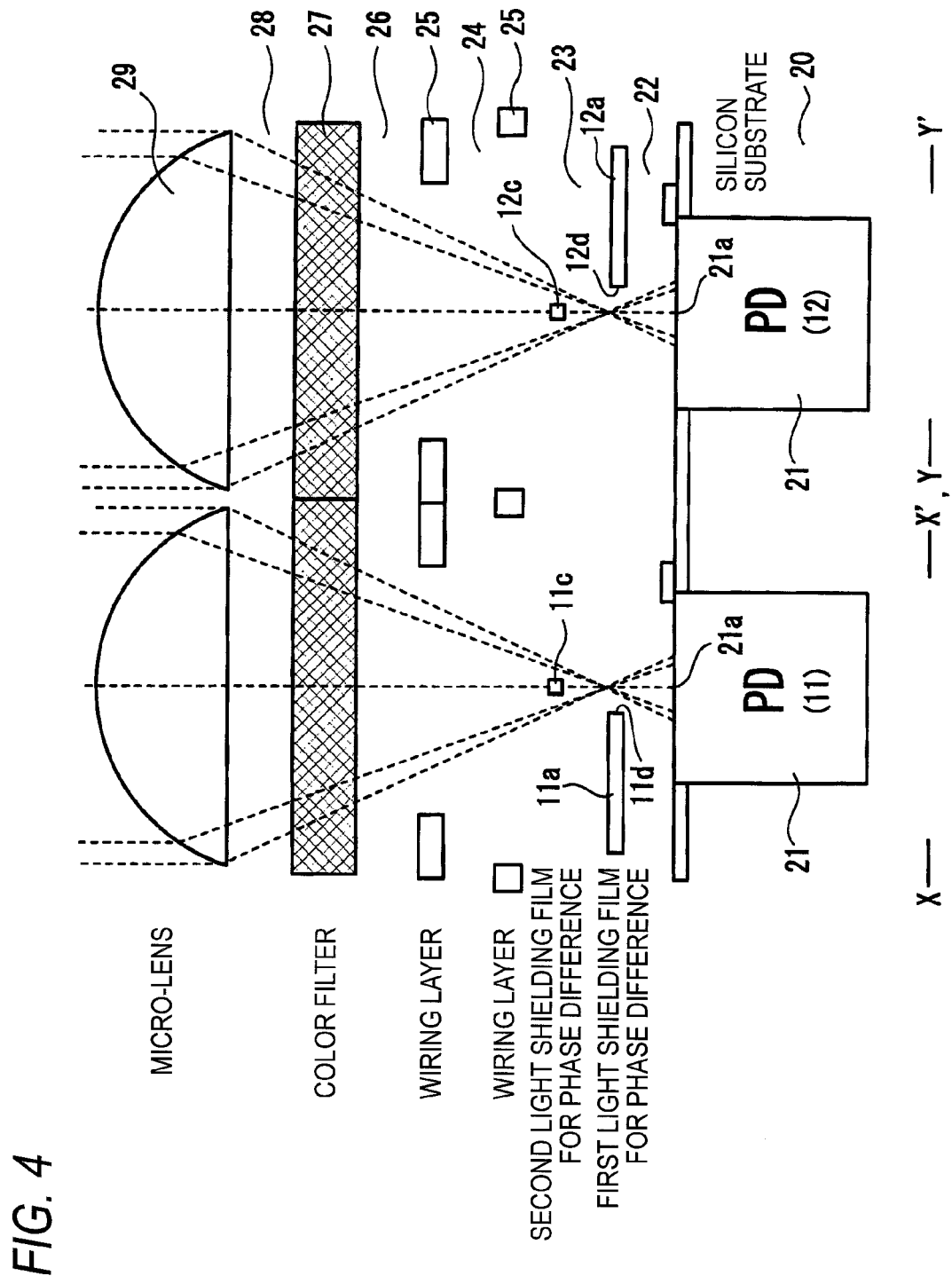
FIG. 4 A schematic sectional view in which a section taken on line X-X' and a section taken on line Y-Y' in FIG. 2 are arranged in parallel.

FIG. 4 is a schematic sectional view showing a section taken on line X-X' and a section taken on line Y-Y' in FIG. 2 which are arranged in parallel. In the image sensor, for example, n regions 21 are formed in a two-dimensional array on a surface p well layer of an n-type semiconductor substrate 20. Thus, photodiodes (PD) 21 are formed as photoelectric conversion devices. The PD on the left side of FIG. 4 serves as a photoelectric conversion portion of the pixel 11 (FIG. 2), and the PD on the right serves as a photoelectric conversion portion of the pixel 12 (FIG. 2).

The first light shielding film 11a, 12a is formed on the surface of the semiconductor substrate 20 through a leveling film 22. The second light shielding film 11c, 12c is formed thereon through a leveling film 23. A wiring layer (a wiring layer of the image sensor which is of a CMOS type in this example) 25 is laminated further thereon through a leveling film 24 or the like. A color filter 27 is laminated thereon through a leveling film 26. A micro-lens 29 is formed thereon through a leveling film 28.

The first light shielding film 11a, 12a is formed in a position near the position where the micro-lens 29 condenses light. The second light shielding film 11c, 12c is formed in a position closer to this side (micro-lens side) than the position where the micro-lens 29 condenses light.

An edge 11d which is located on the paired pixel 12 side of the first light shielding film 11a provided in the pixel 11 is provided to be displaced on the opposite side to the pixel 12 from a center 21a of the photodiode (PD) 11. The second light shielding film 11c is provided just above the center 21a.

An edge 12d which is located on the paired pixel 11 side of the first light shielding film 12a provided in the pixel 12 is provided to be displaced on the opposite side to the pixel 11 from a center 21a of the photodiode (PD) 12. The second light shielding film 12c is provided just above the center 21a.

Incident light shown in FIG. 4 is depicted in a state where it is incident perpendicularly on each pixel of the image sensor (in a normal direction of the pixel) (the incident angle θ is 0 degree). In this state, the incident light is partially blocked by the second light shielding film 11c, 12c. Thus, the light sensitivity of each pixel 11, 12 is lower than its maximum light sensitivity. Without the presence of the second light shielding film 11c, 12c, the light sensitivity of each pixel 11, 12 should be raised to the maximum light sensitivity because the incident light could not be blocked by the first light shielding film 11a, 12a. In this embodiment, however, the light sensitivity of each pixel 11, 12 is lower than the maximum light sensitivity because the second light shielding film 11c, 12c is provided in an optical path of the incident light which is incident vertically.

Figure 8:
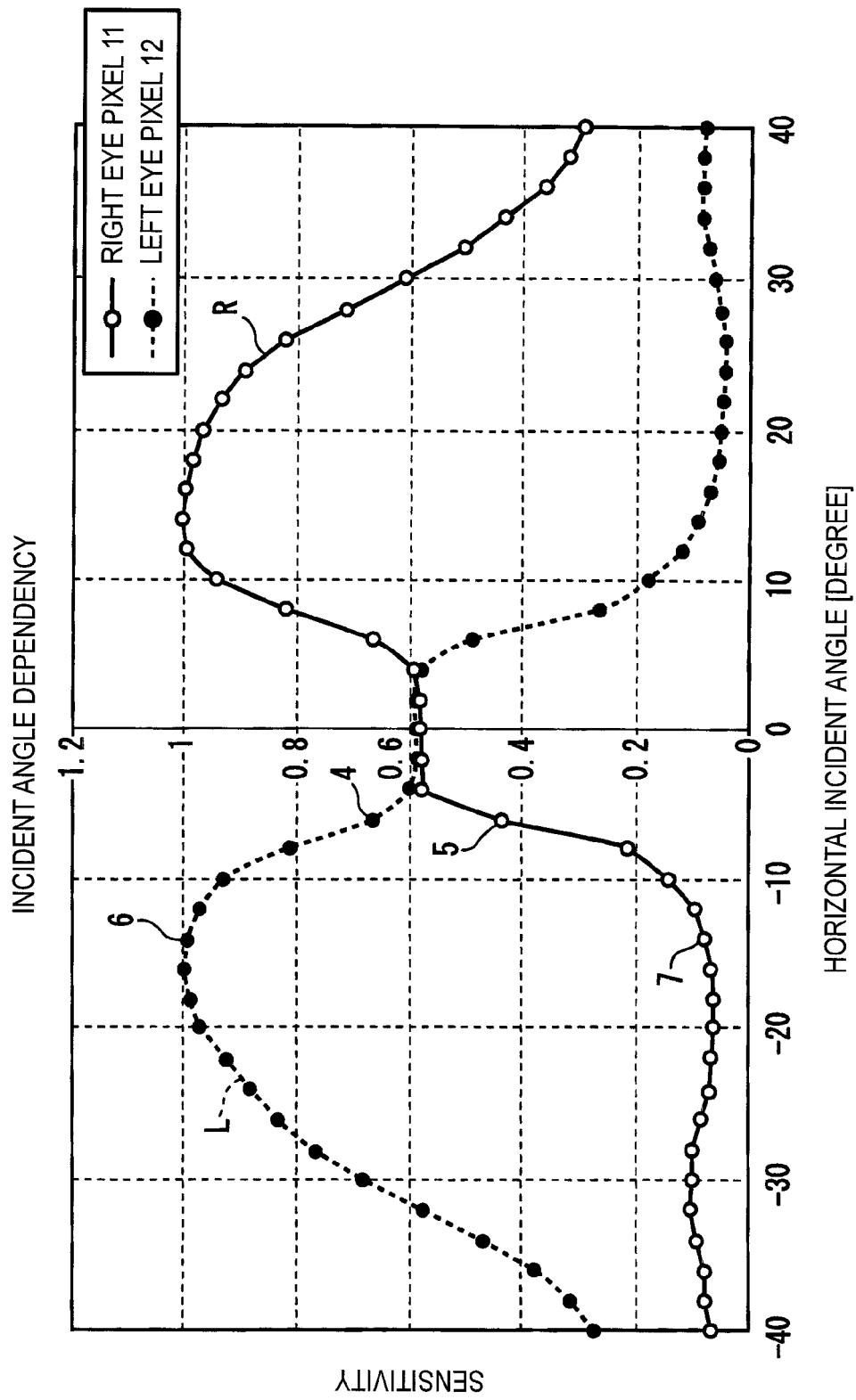
FIG. 8 A graph showing the relationship between light sensitivities and incident angles of paired pixel shown in FIG. 2.

FIG. 8 is a graph (normalized with the maximum light sensitivity) in which the relationship between the incident light angle and the light sensitivity on each pixel 11, 12 is plotted. A characteristic line L designates the relationship between the incident light angle and the light sensitivity on the pixel 12, and a characteristic line R designates the same relationship on the pixel 11. As shown in FIG. 8, in this embodiment, the light sensitivity is set at about 0.6 times of the maximum light sensitivity (which is set as "1") in both the pixels 11 and 12 when the incident light angle is 0 degree.

Figure 5:
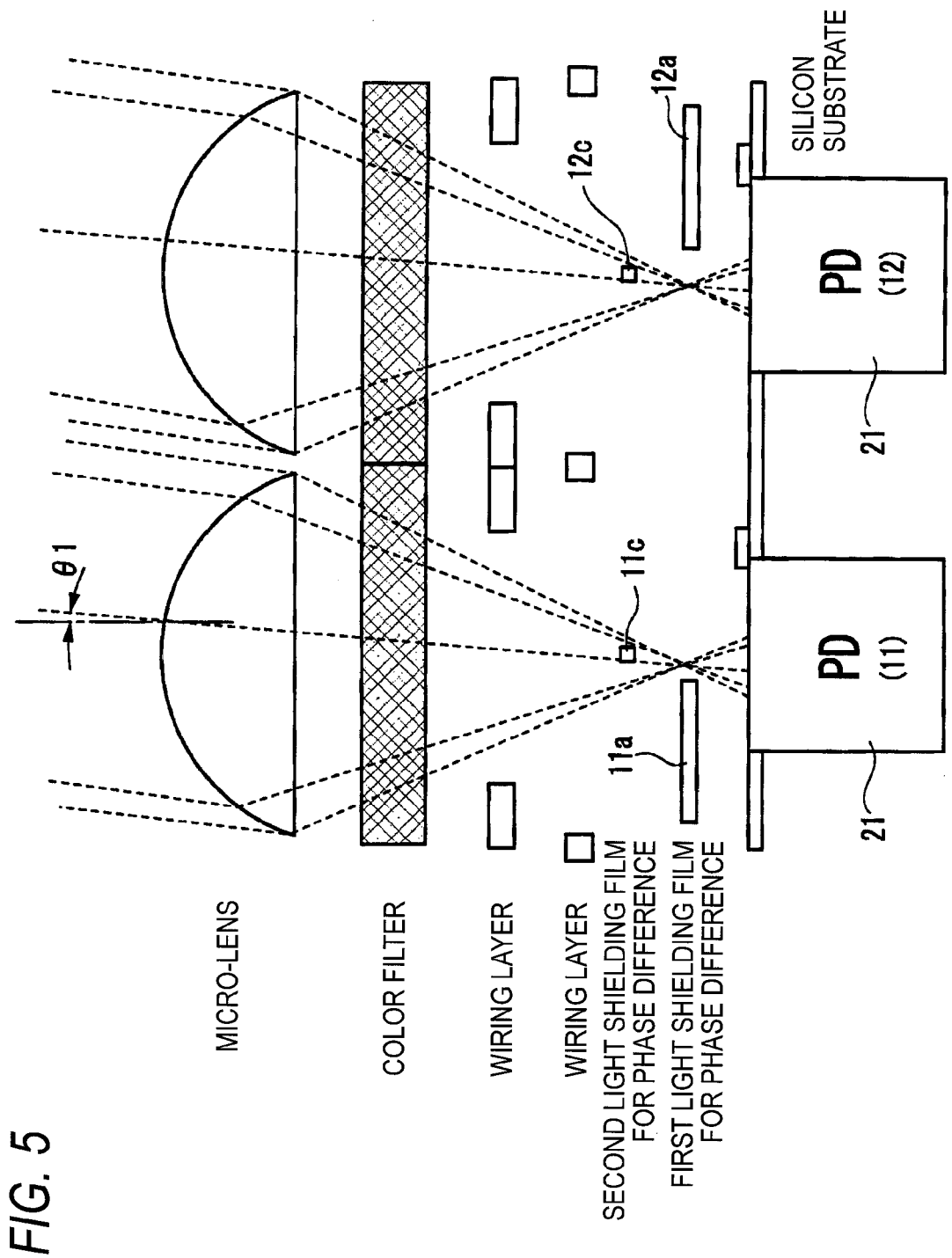
FIG. 5 A view showing a state where the incident angle of incident light is inclined slightly as compared with FIG. 4.

FIG. 5 shows a state where the incident light angle is inclined by only −θ1 with respect to that in FIG. 4. Also in this state, there is no change of light sensitivity in both the pixels 11 and 12 because the second light shielding films 11c and 12c are present in the incident light paths. Thus, the light sensitivity can be kept in the state of 0.6 with respect to the maximum light sensitivity.

Figure 6:
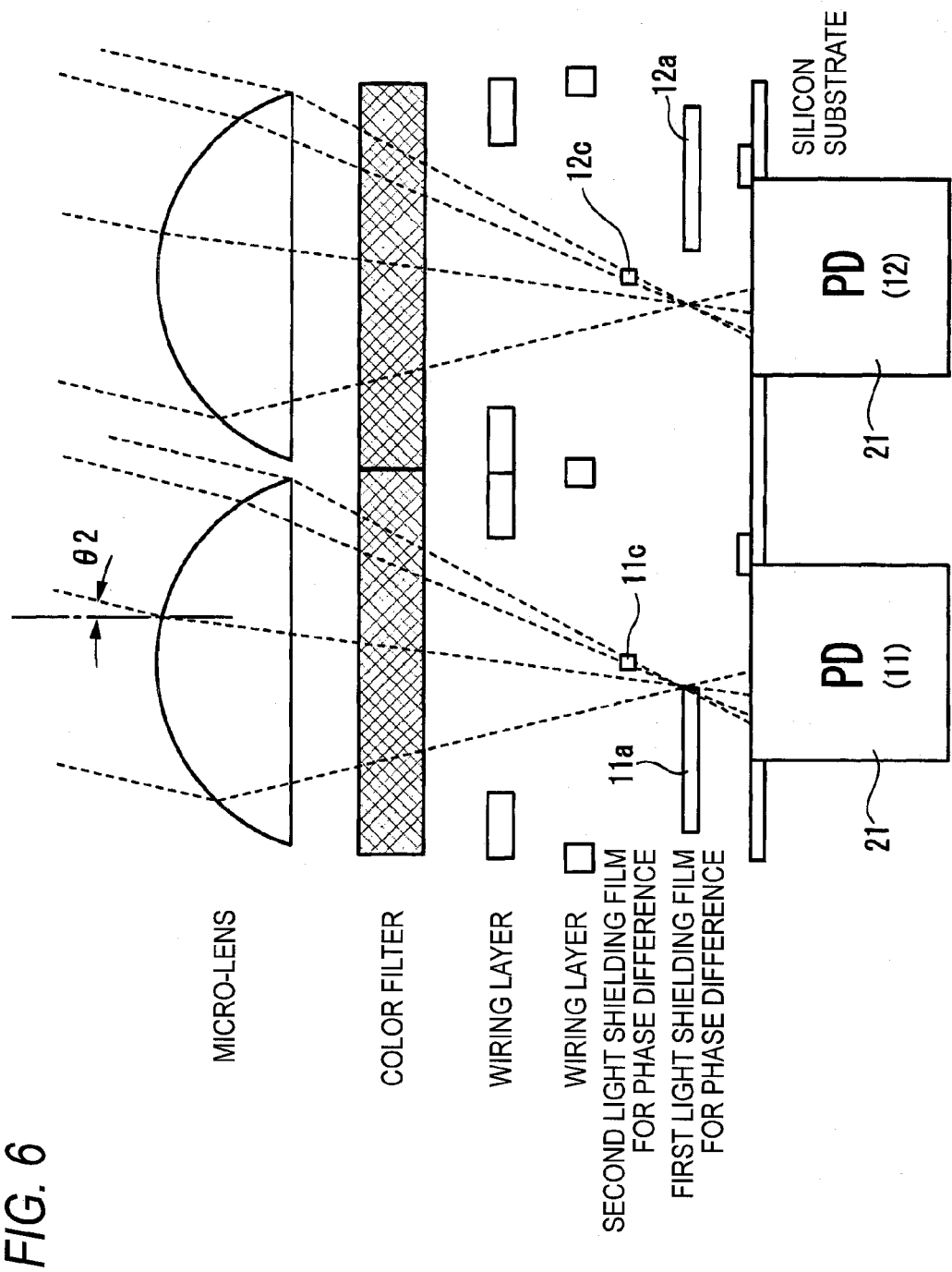
FIG. 6 A view showing a state where the incident angle of incident light is further inclined as compared with FIG. 5.

FIG. 6 shows a state where the incident light angle is further increased and inclined by −θ2. In this state, the second light shielding film 11c, 12c begins to be out of the incident light path. In the pixel 11, the incident light begins to strike against the first light shielding film 11a. In the pixel 12, the incident light begins to enter only into the opening 12b where there is no light shielding film. As a result, the light sensitivity of the pixel 12 begins to increase as shown by the reference numeral 4 in FIG. 8 while the light sensitivity of the pixel 11 begins to decrease as shown by the reference numeral 5.

Figure 7:
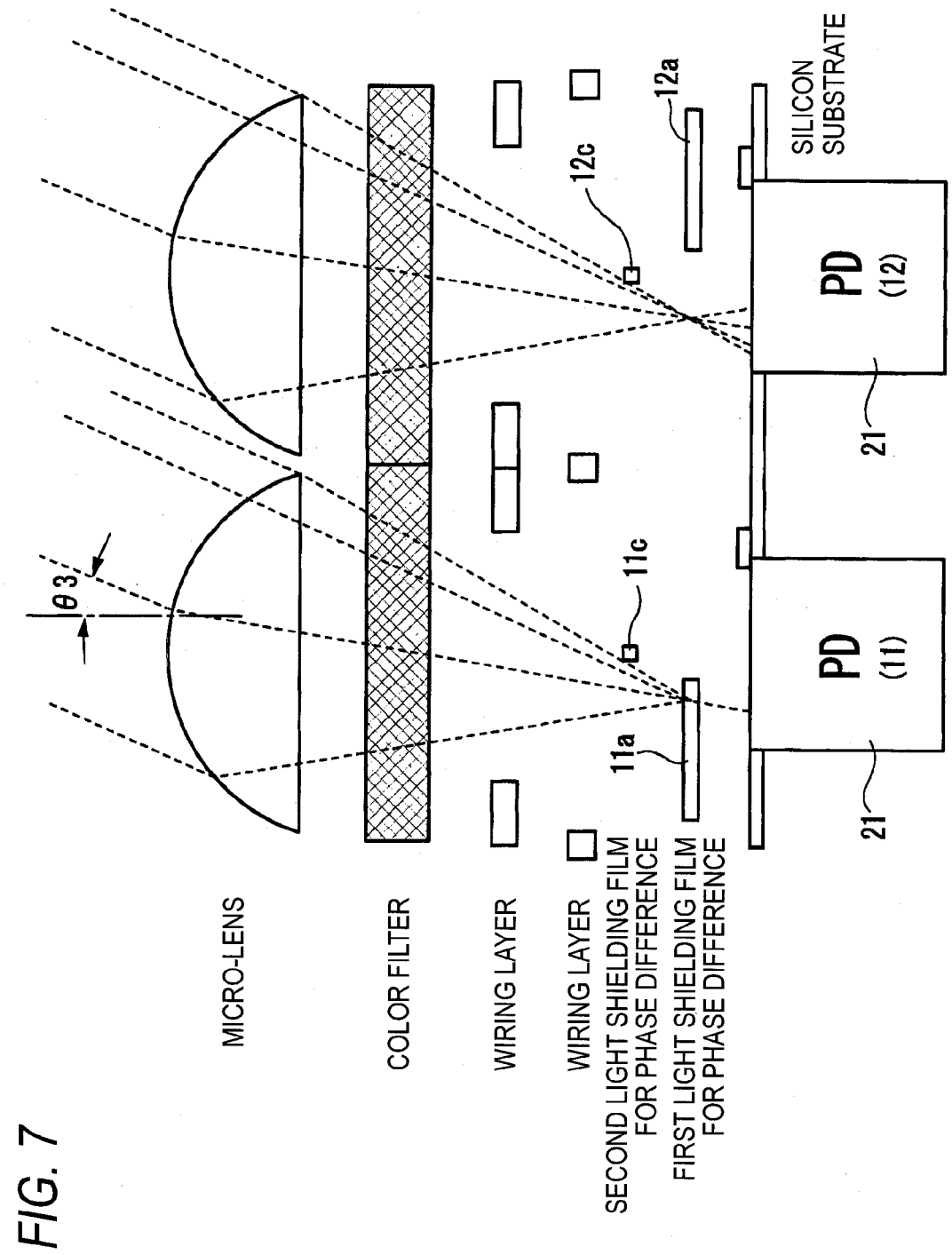
FIG. 7 A view showing a state where the incident angle of incident light is further inclined as compared with FIG. 6.

FIG. 7 shows a state where the incident angle is further increased and inclined by −θ3. In this state, most of the incident light is shielded by the light shielding film 11a in the pixel 11. Thus, the light that can be received by the pixel 11 is limited to stray light or diffracted light. In the pixel 12, there is no incident light shielded by the light shielding film. As a result, the pixel 12 reaches the maximum light sensitivity as shown by the reference numeral 6 in FIG. 8 while the pixel 11 reaches the minimum light sensitivity as shown by the reference numeral 7. When the incident angle is increased further, the incident light begins to be out of the photodiode 21 (12). Thus, the light sensitivity is decreased.

The aforementioned description has been made in the state where the incident angle of the incident light is inclined on the minus side. Even when the incident light is inclined on the plus side, similar light sensitivity can be obtained totally as shown by the characteristic line in FIG. 8. That is, in a predetermined angle range inserted with the incident angle of 0 degree, the light sensitivity is flat and lower than the maximum light sensitivity all over the range. In a region beyond the range, the light sensitivity is characterized by a light sensitivity curve varying like a mountain.

Figure 9:
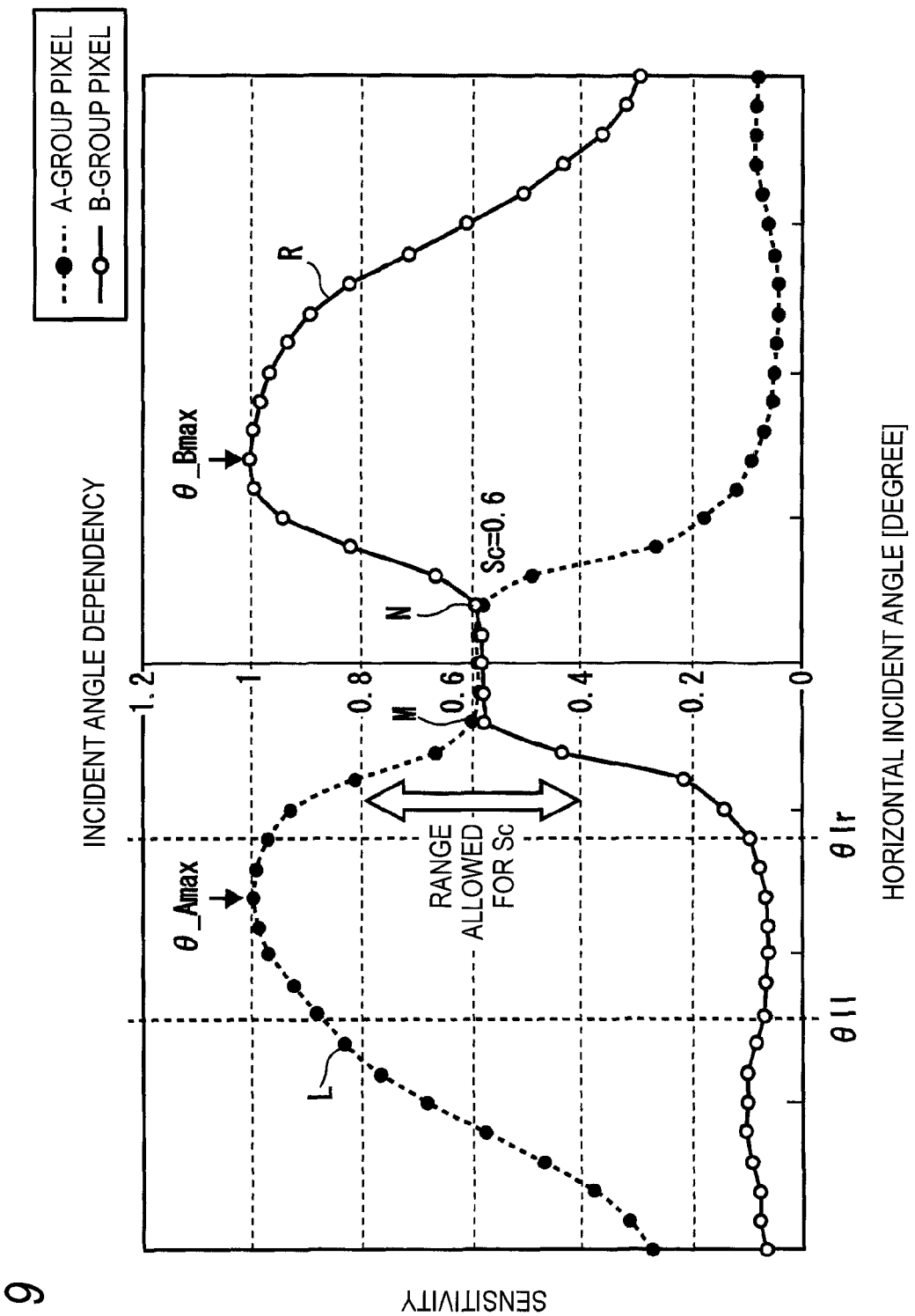
FIG. 9 A view for explaining parameters Sc, θAmax and θBmax in the graph of FIG. 8.
Figure 10:
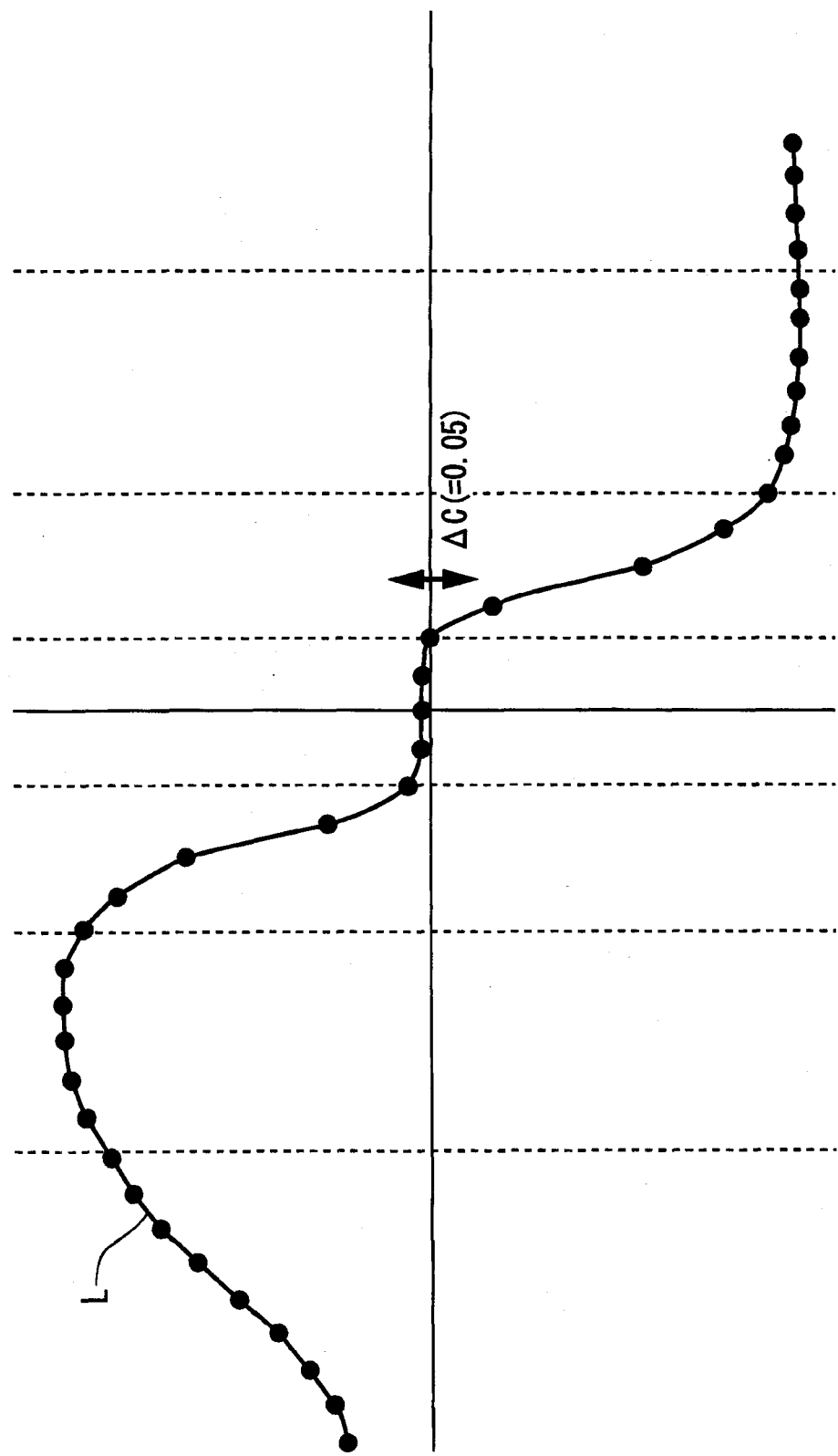
FIG. 10 A view for explaining a parameter Δc in the graph of FIG. 8.

FIG. 9 is a view showing the graph in FIG. 8 again. In the embodiment of FIG. 8, the light sensitivity Sc of each pixel 11, 12 at the incident angle of 0 degree has been explained as about 0.6 of the maximum sensitivity. However, the light sensitivity Sc is not limited to "0.6", but can be controlled by the width of the second light shielding film 11c, 12c, or the like. Preferably, the Sc is designed within a range of 0.4 to 0.8. FIG. 10 is a graph showing the characteristic line L of the pixel 11. Although the flat light sensitivity Sc has been described in FIG. 9, an error Δc of the flatness, that is, a difference in light sensitivity is preferably set to be larger than 0 but not larger than 0.05 with respect to the maximum light sensitivity "1". Not to say, it is the best that the Δc can be made zero.

Figure 11:
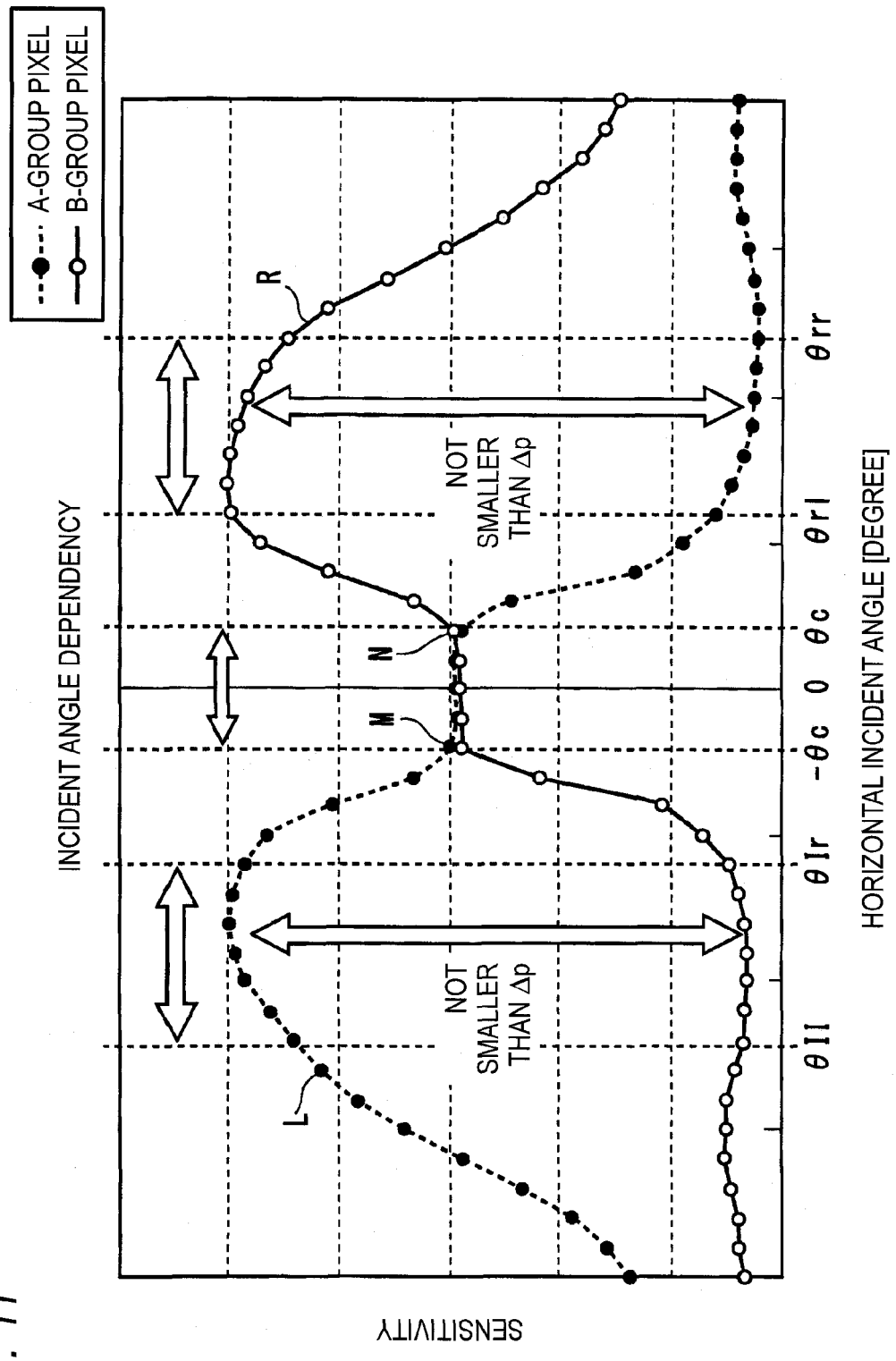
FIG. 11 A view for explaining parameters θc, Δp, θIr, θrI, θII and θrr in the graph of FIG. 8.

FIG. 11 is a view showing the graph of FIG. 8 again. The incident angle range where the light sensitivity Sc is flat is set as −θc to +θc. The pixels 11 and 12 are manufactured to be quite similar to each other, except that the first light shielding film openings 11b and 12b are formed at symmetric positions. Therefore, the range where the light sensitivity Sc is flat or the magnitude of the light sensitivity Sc overlaps between the pixel 11 and the pixel 12.

The aforementioned matter may be described in other words as follows. That is, characteristics with respect to the incident angle as to the absolute value of the rate of change in the light sensitivity of the pixel 11 with respect to the incident angle and the absolute value of the rate of change in the light sensitivity of the pixel 12 with respect to the incident angle are flat within a range of the incident angle between an inflection point M (incident angle $-\theta cA$) and an inflection point N (incident angle $\theta cB$).

Figure 28:
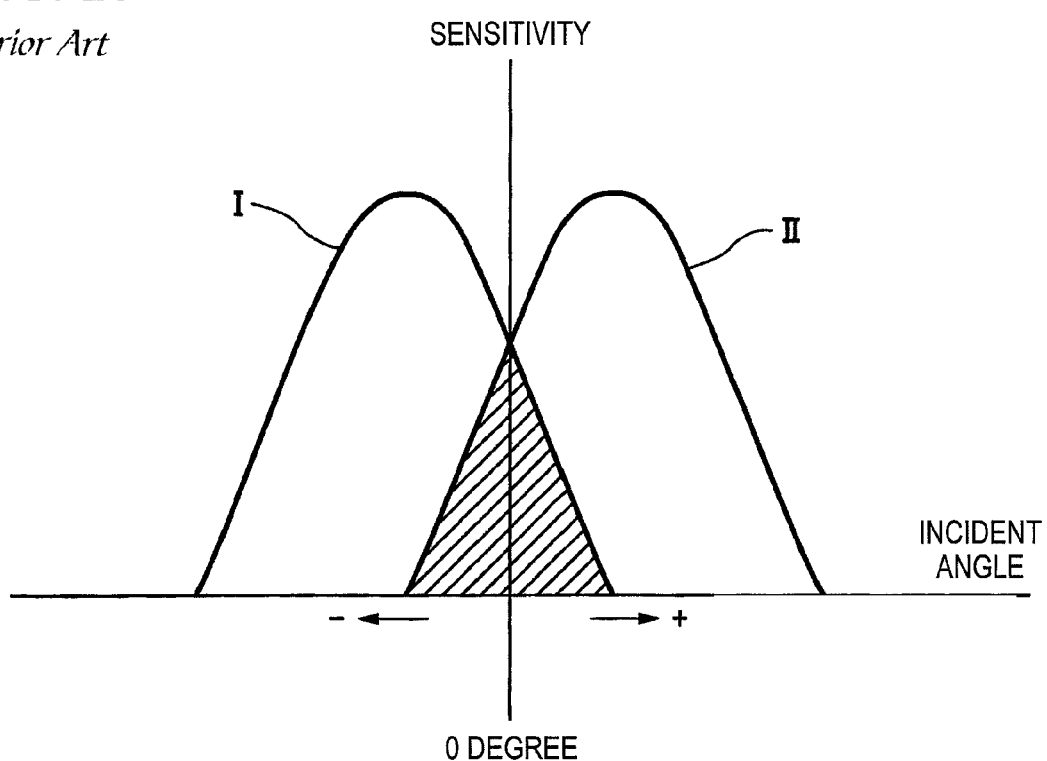
FIG. 28 A graph showing the relationship between sensitivities and incident angles of paired pixels in the image sensor shown in FIG. 27.

In a configuration from which the second light shielding films $11c$ and $12c$ in the embodiment are absent, the incident light dependency of the light sensitivity of each pixel is formed as a graph like a normal distribution as shown in FIG. 28. However, when the second light shielding films $11c$ and $12c$ are provided, two inflection points M and N are generated in a graph of normal distribution in this embodiment. Thus, the flat part of the light sensitivity Sc can be generated.

In addition, in the incident angle range near the maximum light sensitivity of the pixel 11, a difference $\Delta p$ with the light sensitivity of the paired pixel 12 is measured, and an incident angle range satisfying the relation $\Delta p \geq$ threshold t (for example t=0.8) is obtained. This incident angle range is set as "$\theta Ir$ to $\theta II$". In the same manner, in the incident angle range near the maximum light sensitivity of the pixel 12, a difference $\Delta p$ with the light sensitivity of the paired pixel 11 is measured, and an incident angle range satisfying the relation $\Delta p \geq$ threshold t is obtained. This is set as "$\theta rI$ to $\theta rr$".

That is, the first light shielding films $11a$ and $12a$ and the second light shielding films $11c$ and $12c$ are designed satisfying, for example, $\theta II=-20$ degrees, $\theta Ir=-12$ degrees, $\theta rI=+12$ degrees and $\theta rr=+20$. The parameters $\theta Ir$, $\theta rI$ and $\Delta p$ can be controlled by the first light shielding films, and the parameters $\theta c$ and $\Delta c$ can be controlled by the second light shielding films.

In the image sensor (imaging device) 10 according to the embodiment, as described above, the difference between the light sensitivity of each A-group pixel and the light sensitivity of each B-group pixel (A-group light sensitivity−B-group light sensitivity) can be suppressed to be not higher than $\Delta c$ (e.g. 0.05) within a range of the incident angle $\pm \theta c$ (e.g. 6 degrees) while ensuring at least $\Delta p$ (e.g. 0.8) as the difference between the light sensitivity of each A-group pixel and the light sensitivity of each B-group pixel within a range of $\theta II<$incident angle$<\theta Ir$ and $\theta rI<$incident angle$<\theta rr$.

To this end, the image sensor 10 according to the embodiment is mounted on a camera so as to control the incident angle of the incident light (the control can be achieved by selection of the value of an F-number). Thus, imaging can be changed over between a 3D imaging mode and a 2D imaging mode.

For example, when an image is taken with the diaphragm on the small diaphragm side in comparison with an F-number of 5.6, the incident angle of the incident light is within $\pm 5.1$ degrees so that the incident light can enter the flat part Sc in FIG. 8. Thus, it is possible to obtain a 2D image without any phase difference in both each A-group pixel and each B-group pixel, that is, all over the pixels.

On the other hand, when an image is taken with the diaphragm on the open side in comparison with an F-number of 2.2, the incident angle of the incident light reaches at least $\pm 12.8$ degrees. Thus, incident lights with different phase differences enter each A-group pixel and each B-group pixel respectively. Thus, it is possible to obtain a 3D image.

Figure 12:
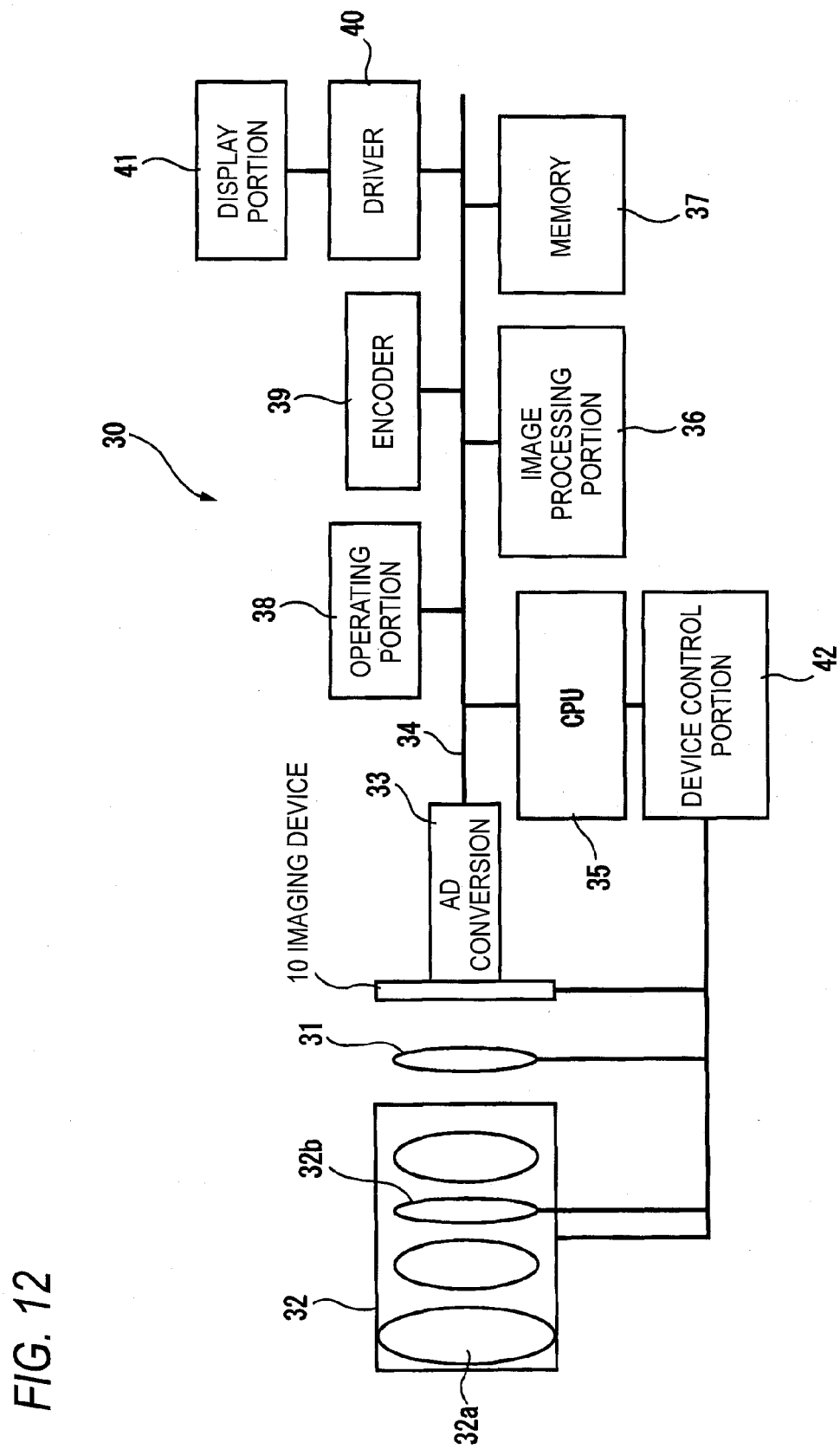
FIG. 12 A functional block diagram of an imaging apparatus according to one embodiment of the invention.

FIG. 12 is a functional block diagram of an imaging apparatus (digital camera) mounted with the image sensor 10 according to the aforementioned embodiment. This imaging apparatus 30 has a shutter 31 and an imaging optical system 32 in a stage in front of the image sensor 10. Not only an imaging lens $32a$ but also a diaphragm (iris) $32b$ are provided in the imaging optical system 32.

An output of an analog taken image signal of a subject imaged by the image sensor 10 is converted into a digital taken image signal by an AD conversion portion 33 and the converted digital taken image signal is outputted to a bus 34. A CPU 35 for generally controlling the whole of the imaging apparatus 30, an image processing portion 36 for importing the digital taken image signal and performing well-known image processing thereon, a memory 37, an operating portion 38 including a shutter button, a menu selection button, etc., an encoder for performing image compression etc., and a driver 40 are connected to the bus 34.

A display portion 41 provided on the back of the camera or the like is connected to the driver 40. A device control portion 42 for driving the imaging optical system 32, the shutter 31 and the image sensor (imaging device) 10 is connected to the CPU 35. Although not shown, a memory control portion for controlling an external memory such as a memory card for recoding images of subjects is also connected to the bus 34.

The imaging apparatus 30 according to the embodiment is mounted with the image sensor 10 having characteristics shown in FIGS. 8 to 11. That is, the imaging apparatus 30 has the relation of "$\theta II<-\theta c<0<\theta c<\theta rI$". In addition, it is desirable that the light sensitivities Sc of each A-group pixel and each B-group pixel are constant values within a range of "$-\theta c<$incident angle$<+\theta c$". However, within that range, the light sensitivities Sc may have a constant inclination as long as the difference in light sensitivity between the A-group pixel and the B-group pixel is not wider than $\Delta c$ (=about 0.05: on the assumption that the maximum light sensitivity is set as 1). The light sensitivities Sc are predetermined sensitivities within a range of 0.4 to 0.8 on the assumption that the maximum light sensitivity is set as 1.

Therefore, when the F-number is set at an F-number (large F-number) with the diaphragm $32b$ being reduced, the incident light can enter the range of $-\theta c$ to $+\theta c$ with a flat light sensitivity characteristic shown in FIG. 8. It is possible to take an image of a subject without any phase difference or any sensitivity difference between the A-group pixel and the B-group pixel. Thus, a high-definition 2D image can be obtained. When the Sc is set at a low value such as 0.2 or 0.3, only a dark 2D image can be taken. When the Sc is set at a high value such as 0.9 or 0.95, the area where the characteristic line L and the characteristic line R overlap each other increases when a 3D image is taken. Thus, separation performance (phase difference) between left and right images of the 3D image deteriorates. It is therefore preferable that the Sc is set at 0.4 to 0.8.

When a 3D image is to be taken, the diaphragm $32b$ is set at the open F-number (small F-number). As a result, the incident light can enter up to an incident angle with a sensitivity difference $\Delta p$ (at least 0.8 on the assumption that the maximum light sensitivity is set as "1") between the pixels 11 and 12. Thus, it is possible to take a 3D image of a subject.

That is, as shown in the characteristic graph of FIG. 9, the incident angle of the incident light (that is, the F-number) is selected to be within a range of "$\theta II<\theta Amax<\theta Ir$" inserted with an incident angle position $\theta Amax$ where the A-group pixel shows the maximum light sensitivity value and to be within a range of "$\theta rI<\theta Bmax<\theta rr$" inserted with an incident angle position $\theta Bmax$ where the B-group pixel shows the maximum light sensitivity value. Thus, it is possible to obtain an excellent 3D image.

Figure 13:
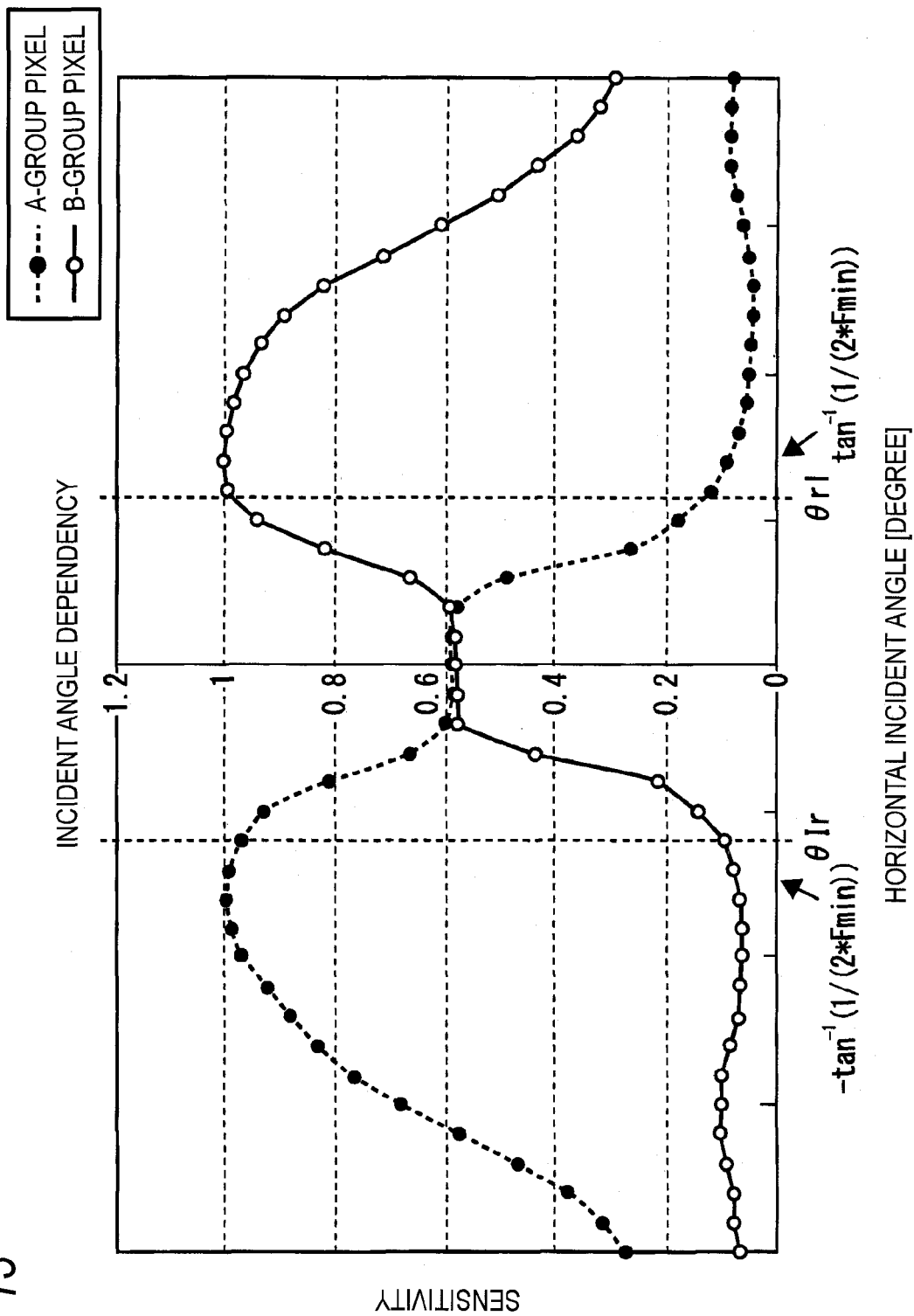
FIG. 13 A view for explaining conversion to an F-number using the parameters θIr and θrI in the graph of FIG. 11.

When a 3D image is taken by the imaging apparatus 30 in FIG. 12, that is, by the image sensor 10, it is necessary to establish "incident angle$<\theta Ir$" and "$\theta rI<$incident angle" as described above. In the case of an imaging apparatus (camera), an incident angle is not controlled directly but an F-number is often controlled to control the "incident angle" indirectly. To this end, the incident angle is converted into the F-number as shown in FIG. 13.

The diaphragm 32b which can vary the F-number is set to satisfy:

$$-\tan^{-1}(1/(2*F\min)) < \theta lr$$

$$\theta rI < \tan^{-1}(1/(2*F\min))$$

where Fmin designates the open valve (minimum value) of the F-number. A table in which the incident angle is converted into the F-number is shown in FIG. 14.

When the light sensitivity has an incident angle dependency as shown in FIG. 13, the conditions of θIr and θrI are determined in accordance with the open value (F-number) of the imaging lens as shown in FIG. 14. The angle θIr is set to have a larger value (closer to 0 degree) than the angle of FIG. 14, and the angle θrI is set to have a smaller value than the angle of FIG. 14. Otherwise, an excellent 3D image cannot be obtained with the diaphragm open.

Figure 15:
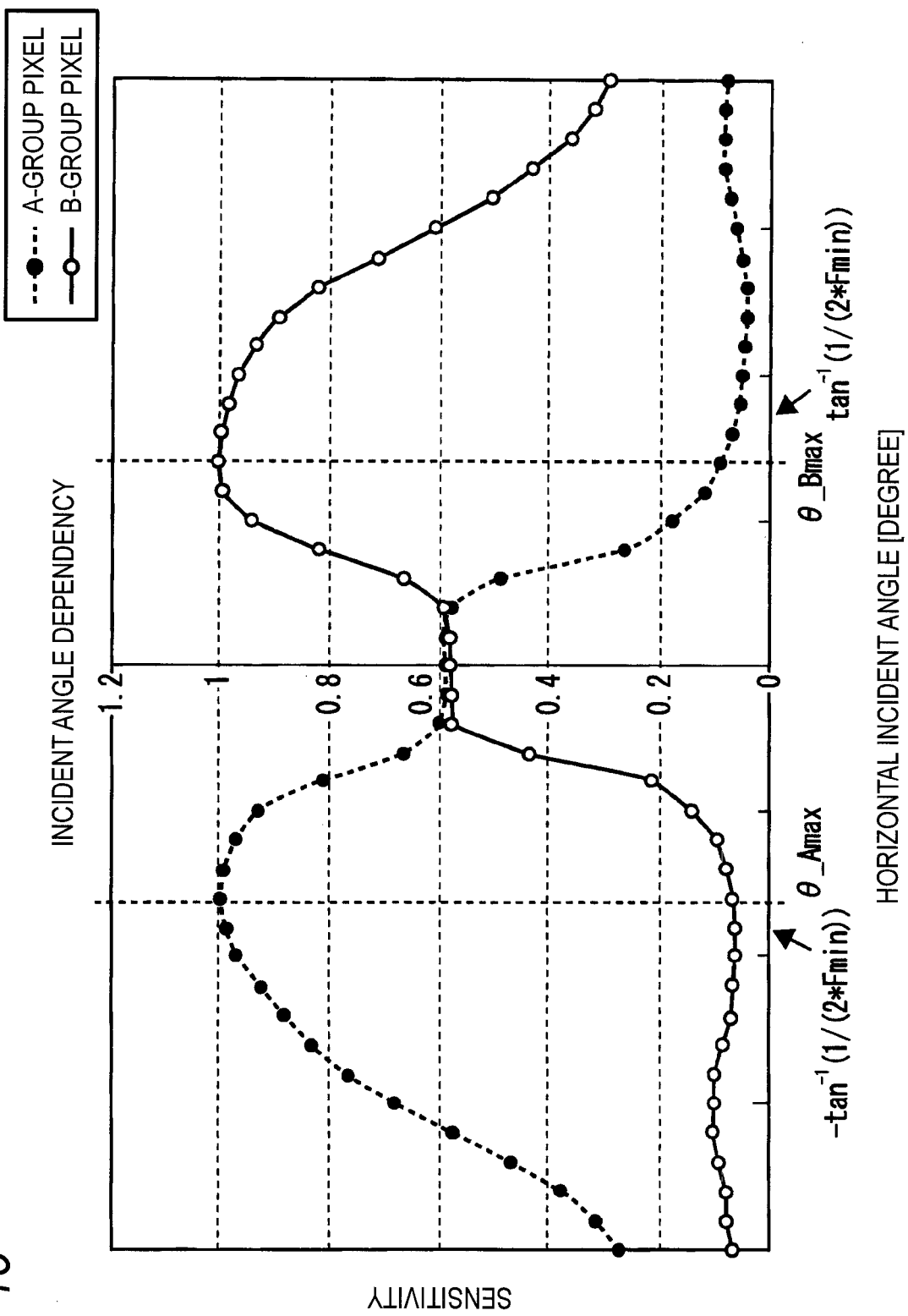
FIG. 15 A view for explaining conversion to an F-number using maximum light sensitivities (θAmax and θBmax) in the graph of FIG. 9.

In FIG. 13 and FIG. 14, the angles ΔIr and θrI determining the range where a 3D image can be obtained are converted into F-numbers. For a higher quality 3D image, it is preferable that imaging is performed with the incident angle positions θAmax and θBmax providing the maximum light sensitivity as shown in FIG. 15. To this end, the θAmax and θBmax providing the maximum light sensitivity are converted into F-numbers to satisfy the relations $-\tan^{-1}(1/(2*F\min)) < \theta A\max$ and $\theta B\max < \tan^{-1}(1/(2*F\min))$. FIG. 16 shows a table where the θAmax and θBmax are converted into F-numbers. When an F-number is selected in accordance with FIG. 16, light at an incident angle with which the light sensitivity of the image sensor 10 has the maximum angle dependency enters the image sensor 10. Thus, a higher quality 3D image can be obtained.

In FIG. 15 and FIG. 16, an F-number corresponding to an incident angle providing the maximum light sensitivity is obtained. However, a further higher quality 3D image may be obtained. In FIG. 13, the range in which the difference in light sensitivity between the pixel 11 and the pixel 12 is not lower than Δp (a predetermined value, for example, 0.8) is set as θII to θIr and θrI to θrr, and the incident angle is determined based on θIr and θrI. However, in FIG. 17, the incident angle (F-number) is determined based on θII and θrr as a maximum range where a phase difference can be obtained. Thus, a high quality 3D image can be obtained. That is, an F-number satisfying $-\tan^{-1}(1/(2*F\min)) < \theta II$ and $\theta rr < \tan^{-1}(1/(2*F\min))$ is selected. FIG. 18 shows the F-number.

Figure 17:
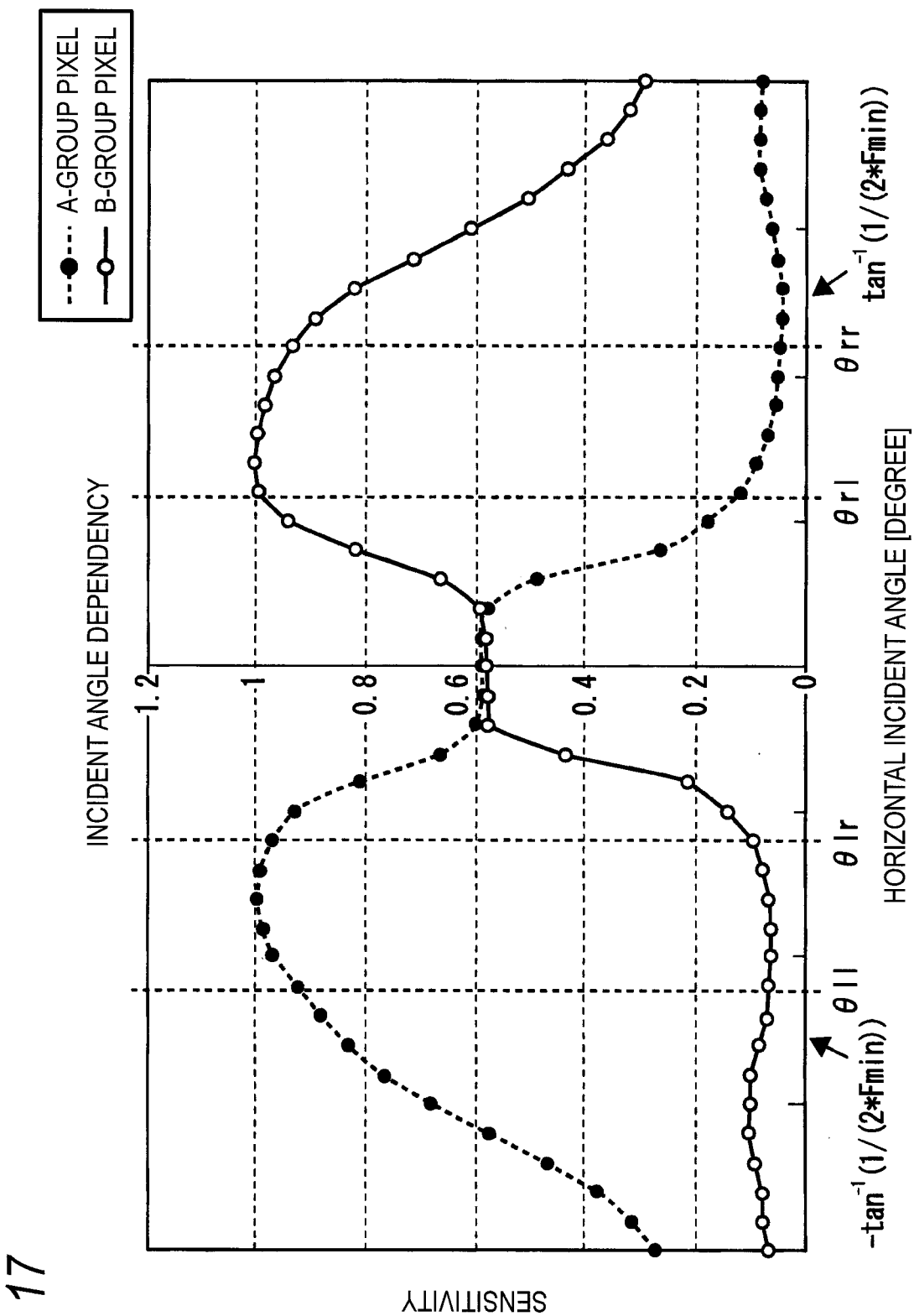
FIG. 17 A view for explaining conversion to an F-number using the parameters θII and θrr in the graph of FIG. 11.

The embodiment in FIG. 17 and FIG. 18 shows the conditions of an imaging diaphragm with which the characteristics of the image sensor 10 can be used to the utmost, so that a 3D image with the best quality can be obtained. In order to use, to the utmost, the region where a phase difference can be obtained, it is necessary to make θII larger than the value in the table and θrr smaller than the value in the table when the open F-number is determined as shown in FIG. 18.

Figure 19:
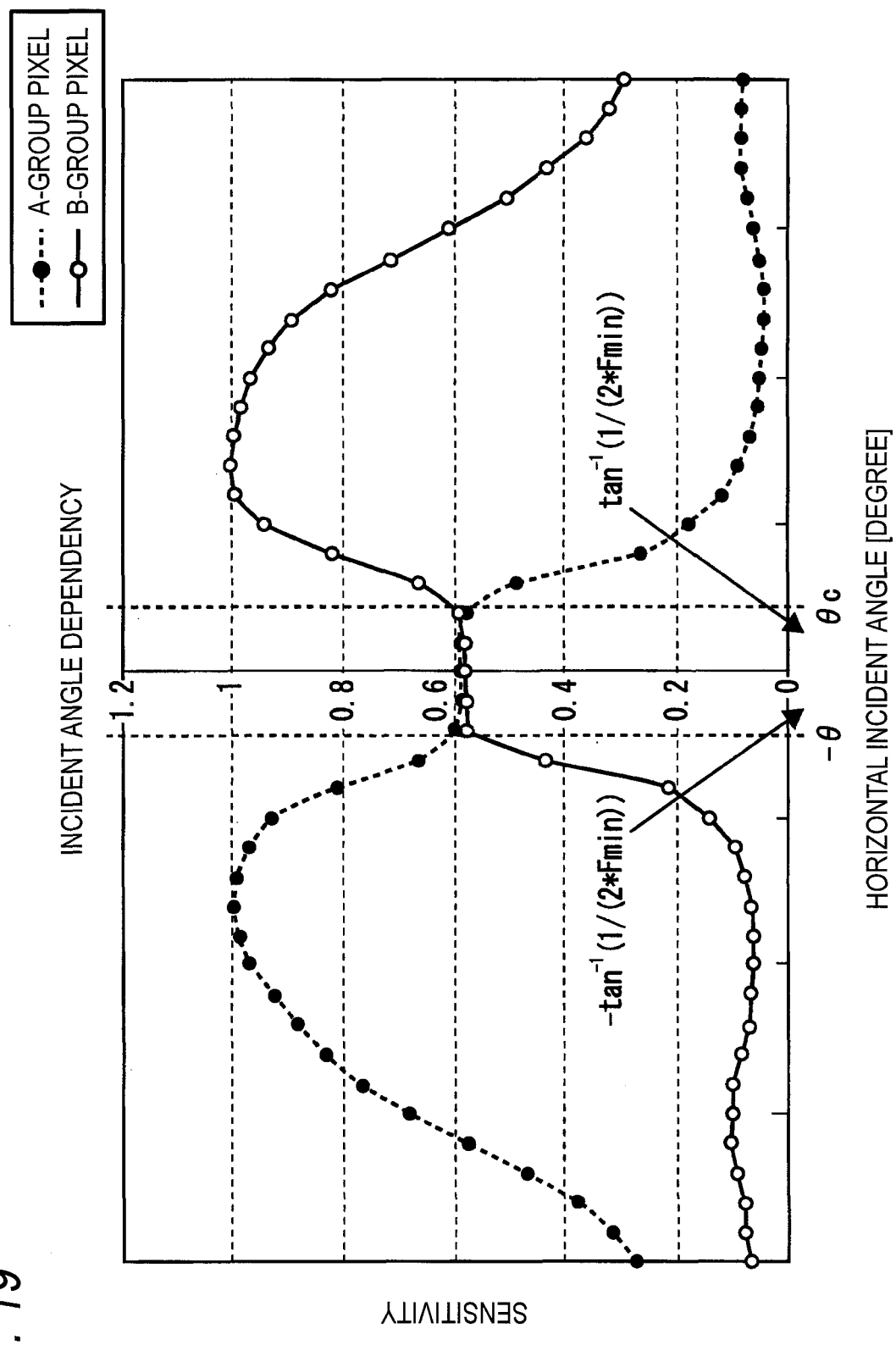
FIG. 19 A view for explaining conversion to an F-number using the parameter θc in the graph of FIG. 9.

FIG. 19 is a graph for converting, into an F-number, the incident angle of θc with which a 2D image can be obtained. FIG. 20 shows the converted F-number. The diaphragm 32b which can vary the F-number is set to satisfy $\tan^{-1}(1/(2*F\max)) < \theta c$ when Fmax designates the small-diaphragm value (maximum value) of the F-number. In this example, an excellent 2D image can be obtained when the F-number is set at a value not lower than 5.6.

Figure 21:
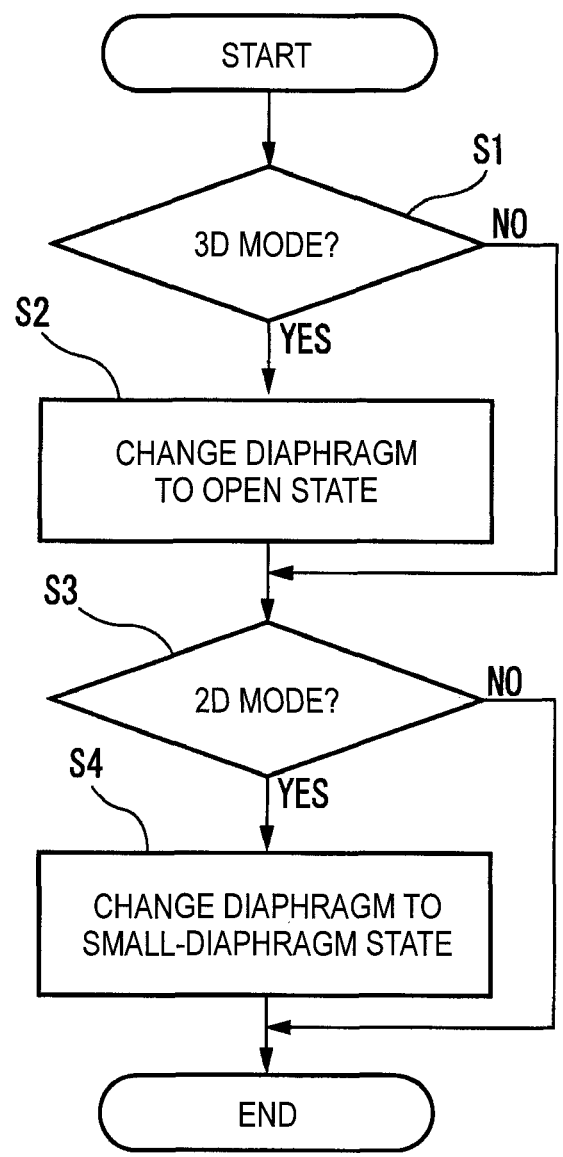
FIG. 21 A flow chart showing a processing procedure of an imaging apparatus according to one embodiment of the invention.
Figure 22:
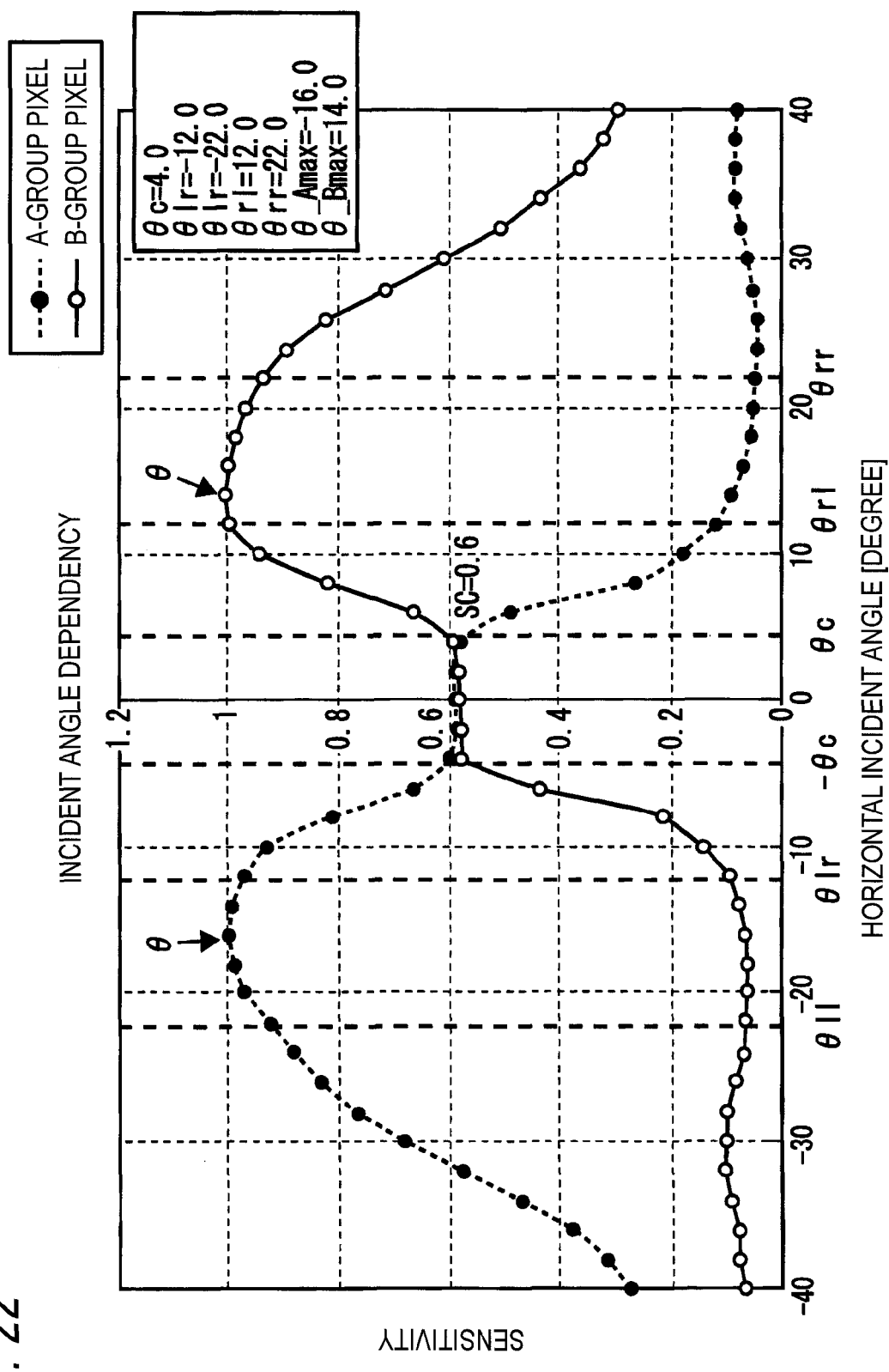
FIG. 22 A graph showing specific examples of parameters of an image sensor.

FIG. 21 is a flow chart showing an imaging procedure in an imaging apparatus. FIG. 22 shows specific examples of characteristics of an image sensor used in the imaging apparatus. According to the characteristics in FIG. 22, it is necessary to make the incident angle not larger than 4 degrees in order to take a 2D image, and it is necessary to make the incident angle not lower than 12 degrees in order to take a 3D image.

First, the CPU (control unit) 35 in FIG. 12 determines an imaging mode specified and inputted by a user, and determines whether the imaging mode is a 3D imaging mode or not (Step S1). Next, in the case where an image is taken in the 3D imaging mode, the flow of processing then advances to Step S2, in which the diaphragm is changed to an open state. As shown in FIG. 23, a 3D image may be taken with an F-number of "1.2" or "2.2". Therefore, the F-number is set at either "1.2" or "2.2".

When the imaging mode is not the 3D imaging mode as a result of the determination in Step S1, the flow of processing advances to Step S3 directly or through Step S2. In Step S3, it is determined whether the imaging mode is a 2D imaging mode or not. In the case of the 3D imaging mode, the result of the determination in Step S3 is negative, and the processing is terminated. In the case of the 2D imaging mode, the flow of processing then advances to Step S4, in which the diaphragm is changed to a small-diaphragm state (the F-number is "7.2" or "11.0" in the example of FIG. 23), and the processing is terminated.

Due to the control made thus, the camera side can select a proper diaphragm value if a user simply changes over the imaging mode when the user wants to take an image in the 3D imaging mode or the 2D imaging mode. It is therefore possible to automatically take an excellent 3D image or a high-definition 2D image.

Figure 24:
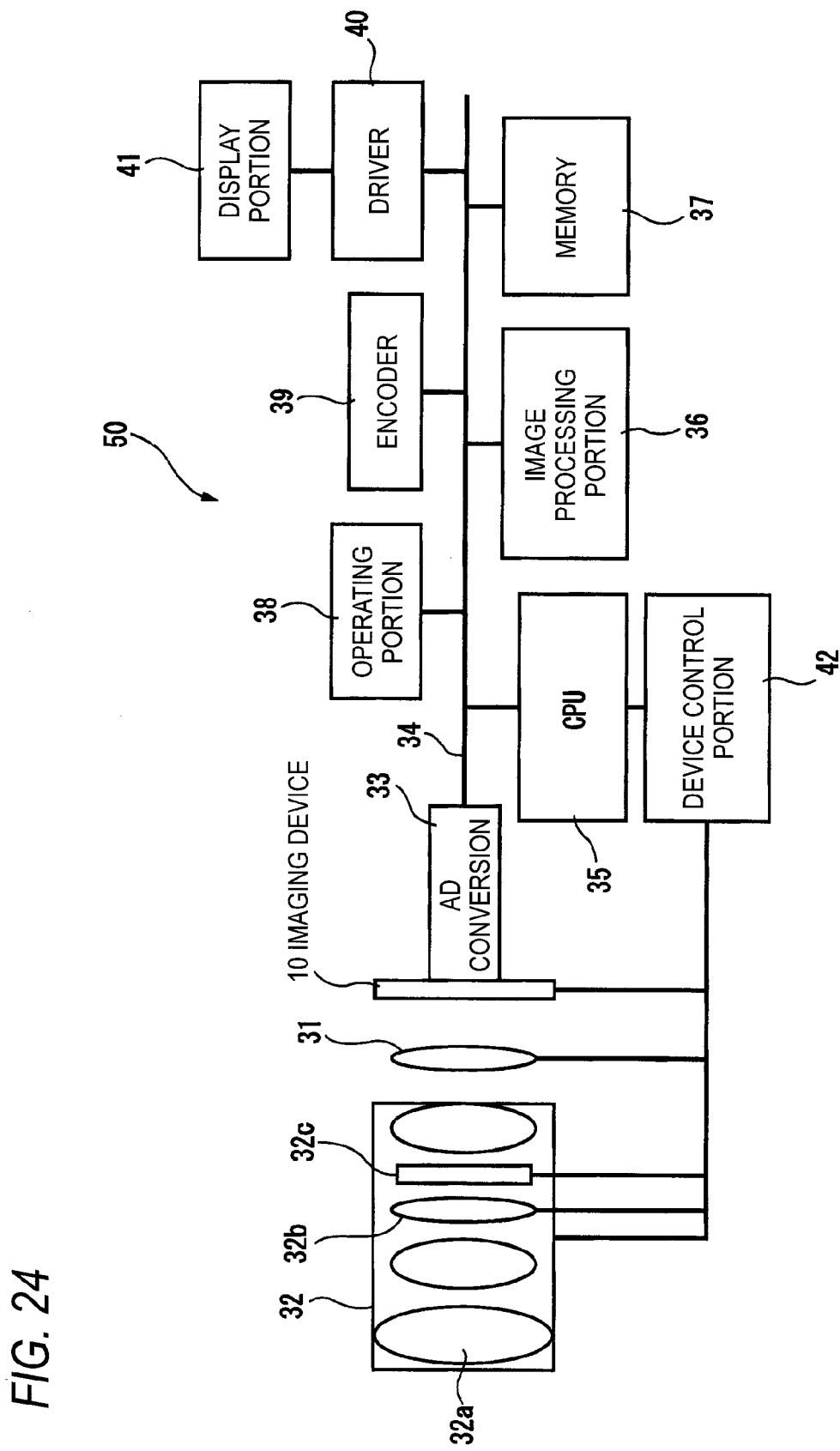
FIG. 24 A functional block diagram of an imaging apparatus according to another embodiment of the invention.

FIG. 24 is a functional block diagram of an imaging apparatus 50 according to another embodiment of the invention. The imaging apparatus 50 is different from the imaging apparatus in FIG. 12 only in the point that an ND filter 32c is additionally provided in the imaging optical system 32 so that the ND filter 32c can be moved into and out of an optical path. The other constituent members are the same as those in FIG. 12. Therefore, the same reference numerals are given to the same members correspondingly, and description thereof will be omitted.

Figure 25:
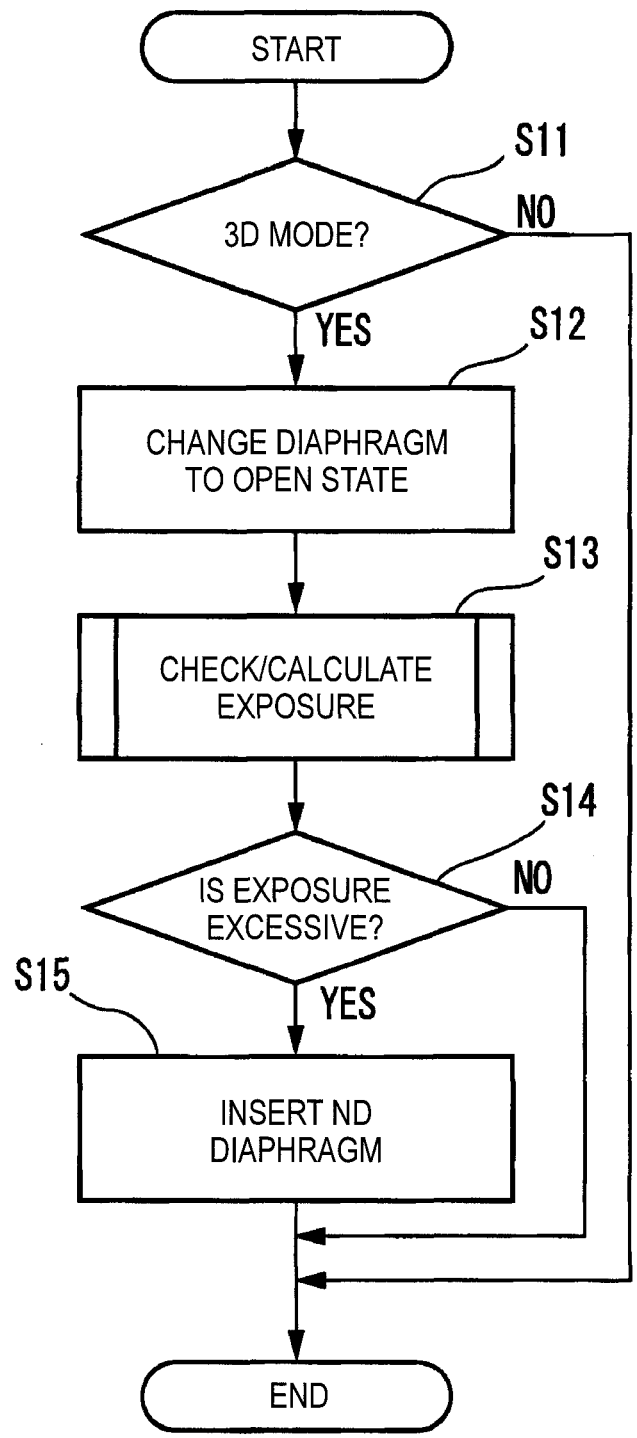
FIG. 25 A flow chart showing an imaging processing procedure of the imaging apparatus shown in FIG. 24.

FIG. 25 is a flow chart showing an imaging procedure by the imaging apparatus 50 according to the embodiment. When the diaphragm is made too small at the time of taking an image in the 3D mode, the incident angle of the incident light becomes too small to take a high quality 3D image. However, when the diaphragm is not made small, the amount of incident light may be excessive.

Therefore, in Step S11, the CPU 35 of the imaging apparatus 50 according to the embodiment first determines whether the imaging mode is a 3D imaging mode or not. When the imaging mode is not a 3D imaging mode, the processing is terminated. In the case of the 3D imaging mode, the flow of processing then advances to Step S12, in which the diaphragm 32b is changed to an open state. In the next Step S13, exposure is checked and calculated. The result of the calculation in Step S13 is determined in Step S14, in which it is determined whether the exposure is excessive or not. When the exposure is excessive, the ND filter is inserted in the next Step S15. Then, the processing is terminated. When the exposure is not excessive, the flow of processing skips Step S15 and the processing is terminated.

According to the embodiment, in this manner, light can be reduced by the ND filter without reducing the opening diaphragm, so that an excellent 3D image can be obtained.

Figure 26:
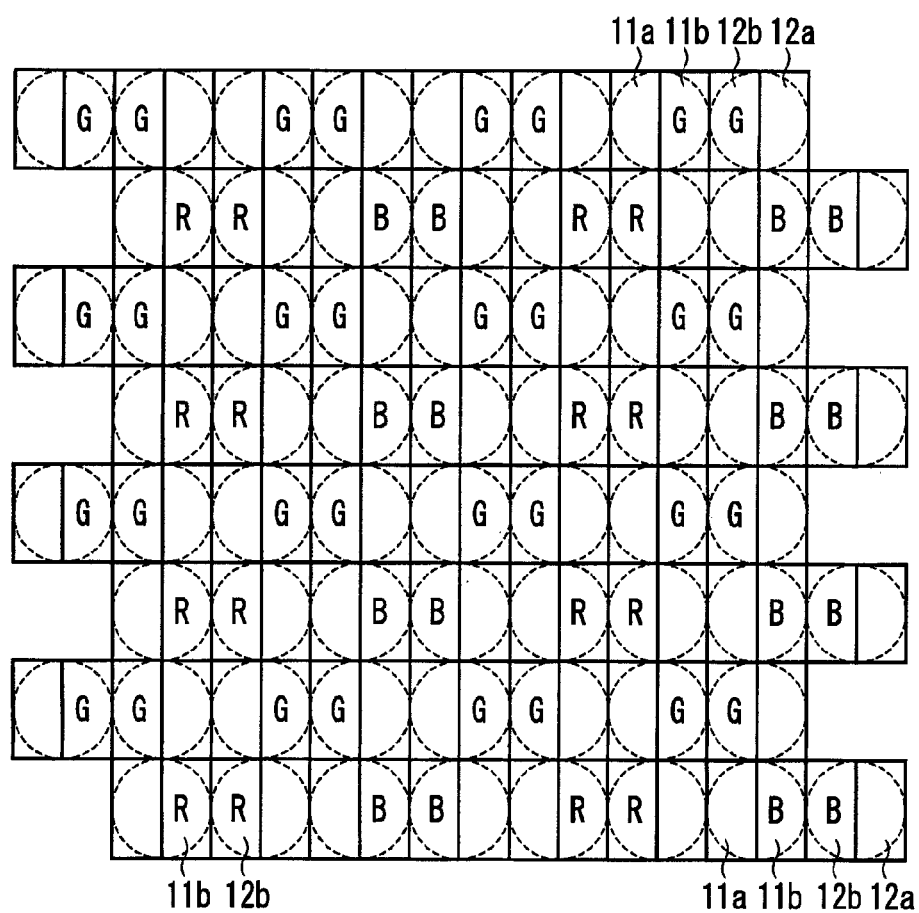
FIG. 26 A surface pattern diagram of an image sensor according to another embodiment of the invention.
Figure 27:
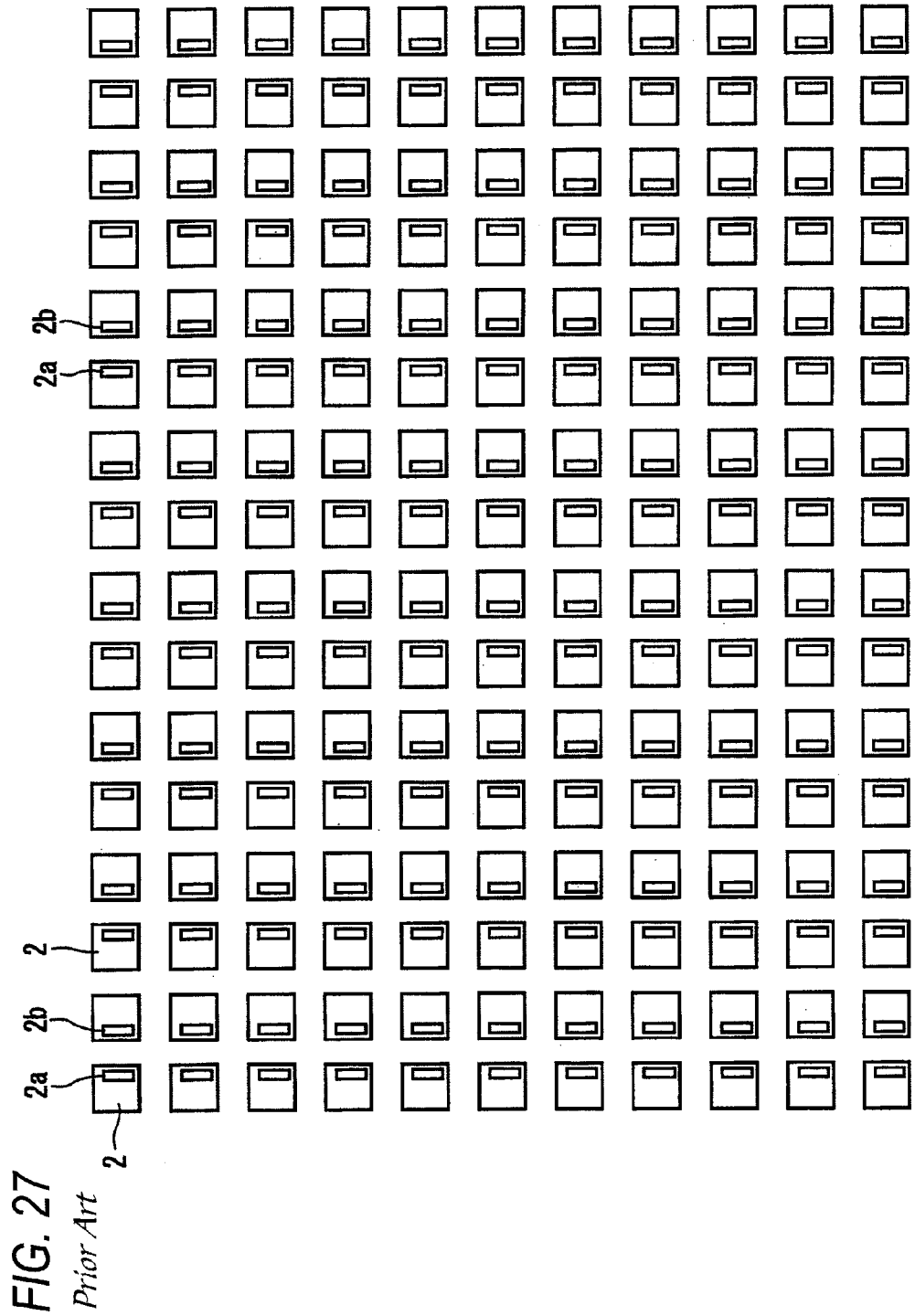
FIG. 27 A surface pattern diagram showing an example of an image sensor for taking a monocular 3D image.

FIG. 26 is a pattern view of an image sensor 60 according to another embodiment, which replaces the image sensor 10 in FIG. 11. In the image sensor 60 according to the embodiment, pixels are arranged in a square grating array, in which G (green) color filters are laminated on all the pixels in odd-numbered rows (or even-numbered rows), and R (red) color filters and B (blue) color filters are laminated on the pixels in even-numbered rows (odd-numbered rows) alternately two pixels by two pixels. Each pair of pixels include two pixels of the same color. A light shielding film opening 11b in one of the pair of pixels and a light shielding film opening 12b in the other pixel are made eccentric in opposite directions with respect to the centers of the pixels respectively.

The pixel array and the color filter array may be represented as follows. When the image sensor 60 with a square grating array in FIG. 26 is inclined obliquely at an angle of 45 degrees, the array can be regarded as a so-called honeycomb pixel array (a pixel array in which the pixels in odd numbered rows and the pixels in even numbered rows are shifted from each other by half a pixel pitch respectively). Of the pixel array, a pixel array located in a checkered pattern (an array of pixels belonging to one same kind in a checkered pattern in which two pixels by two pixels are used as a unit matrix) becomes a square grating array, and a pixel array located in the other checkered pattern (an array of pixels belonging to the other same kind in the checkered pattern) also becomes a square grating array. When color filters of three primary colors are arranged in a Bayer array on both the two square grating pixel arrays, a Bayer filter array in FIG. 26 is formed.

Even in such a pixel array and such a color filter array, the characteristics of FIG. 8 can be achieved if the dimensions and the mutual relation of the first light shielding film and the second light shielding film are designed suitably. Thus, it is possible to take an excellent 3D image or a high-definition 2D image in the same manner as in the aforementioned embodiment.

In the aforementioned embodiment, the second light shielding films 11c and 12c are provided in order to form a flat light sensitivity Sc part with the inflection points M and N (see FIG. 9) on the characteristic line of FIG. 8. However, the invention is not limited thereto.

The image sensor according to the embodiment described above includes: a plurality of pixels arranged and formed in a two-dimensional array so that adjacent ones of the pixels constitute paired pixels and entrance pupils of a first pixel and a second pixel constituting the paired pixels are provided eccentrically in opposite directions to each other with respect to centers of the respective pixels; characterized in that:

an incident angle of light from a subject in the first pixel is an incident angle $\theta cA$ which is within a range between 0° corresponding to a normal direction of the pixels and an incident angle $\theta maxa$ at a maximum light sensitivity, and in which the light sensitivity of the first pixel is within a range of from 40% to 80% of the maximum light sensitivity;

the incident angle in the second pixel is an incident angle $-\theta cB$ which is within a range between 0° corresponding to the normal direction of the pixels and an incident angle $\theta maxb$ at the maximum light sensitivity, and in which the light sensitivity of the second pixel is within a range of from 40% to 80% of the maximum light sensitivity; and light sensitivity characteristics of the first pixel and the second pixel with respect to the incident angles of the first pixel and the second pixel are flat characteristics within an incident angle range of the $\theta cA$ to the $-\theta cB$.

In addition, an image sensor according to the embodiment includes: a plurality of pixels arranged and formed in a two-dimensional array so that adjacent ones of the pixels constitute paired pixels and entrance pupils of a first pixel and a second pixel constituting the paired pixels are provided eccentrically in opposite directions to each other with respect to centers of the respective pixels; characterized in that:

an incident angle of light from a subject in the first pixel is an incident angle $\theta cA$ which is within a range between 0° corresponding to a normal direction of the pixels and an incident angle $\theta maxa$ at a maximum light sensitivity;

the incident angle in the second pixel is an incident angle $-\theta cB$ which is within a range between 0° corresponding to the normal direction of the pixels and an incident angle $\theta maxb$ at the maximum light sensitivity; and characteristics with respect to the incident angle in the first pixel and the second pixel as to an absolute value of a rate of change in the light sensitivity of the first pixel with respect to the incident angle and an absolute value of a rate of change in the light sensitivity of the second pixel with respect to the incident angle are flat within a range of the incident angle between the incident angle $-\theta cA$ and the incident angle $\theta cB$.

In addition, the image sensor according to the embodiment is characterized in that: the characteristics are flat when the difference between the light sensitivity of the first pixel and the light sensitivity of the second pixel is in a range not lower than 0 and not higher than 0.05 on the assumption that the maximum light sensitivity is set as 1.

In addition, the image sensor according to the embodiment is characterized in that: the characteristics are flat when the difference between the light sensitivities is in a range higher than 0 but not higher than 0.05.

In addition, the image sensor according to the embodiment is characterized in that: the characteristics are flat when the difference between the light sensitivities is 0.

In addition, the image sensor according to the embodiment is characterized in that: the plurality of pixels are disposed so that the pixels in odd numbered rows and the pixels in even numbered rows are shifted from each other by half a pixel pitch respectively, and color filters of three primary colors are arranged in a Bayer array in the pixels of the odd numbered rows while color filters of three primary colors are arranged in a Bayer array in the pixels of the even numbered rows; and the paired pixels include two pixels which have the color filters of the same color and which are located in the odd numbered row and the even numbered row respectively and obliquely adjacent to each other.

In addition, the image sensor according to the embodiment is characterized in that: the pixel array of the plurality of pixels is a square grating array, and the color filters of the three primary colors are arranged in a Bayer array in pixels which are located in a checkered pattern (pixels belonging to one same kind in a checkered pattern in which two pixels by two pixels are used as a unit matrix) when the square grating array is obliquely inclined at an angle of 45 degrees on a plane where the pixels are arrayed, while the color filters of the three primary colors are arranged in a Bayer array in the other pixels which are located in the checkered pattern (pixels belonging to the other same kind in the checkered pattern), and each pair of the pixels include two pixels which have the color filters of the same color and which are adjacent to each other.

In addition, an imaging apparatus according to the embodiment includes: an image sensor according to any one of the aforementioned paragraphs; and a diaphragm provided in a stage in front of the image sensor; characterized in that: the imaging apparatus further includes a control unit which reduces the diaphragm so that an incident angle range of incident light on the image sensor can be limited within a required angle range when a plane image is taken, and which opens the diaphragm so that incident light whose incident angle range is out of the required angle range can be made incident on the image sensor when a 3D image is taken.

In addition, the imaging apparatus according to the embodiment is characterized in that: the image sensor used in the imaging apparatus has characteristics in which an incident angle θAmax and an incident angle θBmax are expressed by "θIl<θAmax<θIr" and "θrI<θBmax<θrr" respectively when the incident angles θAmax and θBmax provide a maximum light sensitivity to the first pixel and the second pixel respectively, an incident angle range in which a difference between the light sensitivity of the first pixel and the light sensitivity of the second pixel reaches at least 80% of the maximum light sensitivity is "θIl<incident angle<θIr<0", and an incident angle range in which a difference between the light sensitivity of the second pixel and the light sensitivity of the first pixel reaches at least 80% of the maximum light sensitivity is "0<θrI<incident angle<θrr".

In addition, the imaging apparatus according to the embodiment is characterized in that: the incident angle of the incident light is determined based on an F-number.

In addition, the imaging apparatus according to the embodiment is characterized in that: when a 3D image is taken, the following relations are satisfied:

$$-\tan^{-1}(1/(2*F\min))<\theta Ir$$

$$\theta rI<\tan^{-1}(1/(2*F\min))$$

where Fmin designates an open value of the F-number.

In addition, the imaging apparatus according to the embodiment is characterized in that: the following relations are satisfied:

$$-\tan^{-1}(1/(2*F\min))<\theta A\max$$

$$\theta B\max<\tan^{-1}(1/(2*F\min))$$

where Fmin designates an open value of the F-number.

In addition, the imaging apparatus according to the embodiment is characterized in that: the following relations are satisfied:

$$-\tan^{-1}(1/(2*F\min))<\theta Il$$

$$\theta rr<\tan^{-1}(1/(2*F\min))$$

where Fmin designates an open value of the F-number.

In addition, the imaging apparatus according to the embodiment is characterized in that: the following relation is satisfied:

$$-\tan^{-1}(1/(2*F\max))<\theta c$$

where Fmax designates a maximum value as a small-diaphragm value of the F-number.

In addition, the imaging apparatus according to the embodiment is characterized in that: an image is taken with the diaphragm on the open side in comparison with F tan (θrI)/2 when a 3D image is taken, and an image is taken with the diaphragm on the small-diaphragm side in comparison with F tan(θc)/2 when a 2D image is taken.

In addition, the imaging apparatus according to the embodiment is characterized in that: an ND filter is inserted to a stage in front of the image sensor when excess exposure occurs in the case where the diaphragm is opened for taking the 3D image.

In addition, an image sensor according to the invention is characterized by including: a plurality of pixels which are arranged and formed in a two-dimensional array so that adjacent two of the pixels constitute paired pixels; micro-lenses which are laminated on the pixels respectively; first light shielding films which are laminated on the pixels and formed to be as high as light condensing heights of the micro-lenses respectively; light shielding film openings which are opened in the first light shielding films on a first pixel and a second pixel constituting the paired pixels so that the light shielding film openings on the first pixel and the second pixel are provided eccentrically in opposite directions to each other with respect to centers of the pixels respectively; and second light shielding films which are formed in different heights from positions where the first light shielding films are formed, so that light incident on the light shielding film opening of each of the pixels opened toward the center of the pixel can be prevented from perpendicularly entering the center of the pixel while the incident light is allowed to obliquely enter a periphery of the pixel in the eccentric direction.

According to the embodiment described above, not only is it possible to take an excellent 3D image, but it is also possible to take an excellent and high-definition 2D image.

INDUSTRIAL APPLICABILITY

An image sensor and an imaging apparatus according to the invention can take not only an excellent 3D image but also an excellent and high-definition 2D image. Therefore, the image sensor and the imaging apparatus are usefully applied to a digital camera etc.

Although the invention has been described in detail and with reference to specific embodiments, it is obvious for those skilled in the art that various changes or modifications can be made on the invention without departing from the spirit and scope of the invention.

The present application is based on a Japanese patent application (Japanese Patent Application No. 2011-213126) filed on Sep. 28, 2011, the contents of which are incorporated herein by reference.

REFERENCE SIGNS LIST

10,60 image sensor
11,12 paired pixel
11a,12a first light shielding film
11b,12b first light shielding film opening
11c,12c second light shielding film
21 photoelectric conversion portion (PD) of pixel
27 color filter
29 micro-lens
31 shutter
32 imaging optical system
32b diaphragm (iris)
32c ND filter
35 CPU
M,N inflection point

The invention claimed is:

1. An image sensor comprising: a plurality of pixels arranged and formed in a two-dimensional array so that adjacent ones of the pixels constitute paired pixels and entrance pupils of a first pixel and a second pixel constituting the paired pixels are provided eccentrically in opposite directions to each other with respect to centers of the respective pixels; wherein:

an incident angle of light from a subject in the first pixel is an incident angle θcA which is within a range between 0° corresponding to a normal direction of the pixels and an incident angle θmaxa at a maximum light sensitivity, and in which the light sensitivity of the first pixel is within a range of from 40% to 80% of the maximum light sensitivity;

the incident angle in the second pixel is an incident angle −θcB which is within a range between 0° corresponding to the normal direction of the pixels and an incident angle θmaxb at the maximum light sensitivity, and in which the light sensitivity of the second pixel is within a range of from 40% to 80% of the maximum light sensitivity; and light sensitivity characteristics of the first pixel and the second pixel with respect to the incident angles of the first pixel and the second pixel are flat characteristics within an incident angle range of the θcA to the −θcB wherein the characteristics are flat when the difference between the light sensitivity of the first pixel and the light sensitivity of the second pixel is in a range not lower than 0 and not higher than 0.05 on the assumption that the maximum light sensitivity is set as 1.

2. The image sensor according to claim 1, wherein: the characteristics are flat when the difference between the light sensitivities is in a range higher than 0 but not higher than 0.05.

3. The image sensor according to claim 1, wherein: the characteristics are flat when the difference between the light sensitivities is 0.

4. The image sensor according to claim 1, wherein:

the plurality of pixels are disposed so that the pixels in odd numbered rows and the pixels in even numbered rows are shifted from each other by half a pixel pitch respectively, and color filters of three primary colors are arranged in a Bayer array in the pixels of the odd numbered rows while color filters of three primary colors are arranged in a Bayer array in the pixels of the even numbered rows; and the paired pixels include two pixels which have the color filters of the same color and which are located in the odd numbered row and the even numbered row respectively and obliquely adjacent to each other.

5. The image sensor according to claim 1, wherein: the pixel array of the plurality of pixels is a square grating array, and color filters of the three primary colors are arranged in a Bayer array in pixels which are located in a checkered pattern when the square grating array is obliquely inclined at an angle of 45 degrees on a plane where the pixels are arrayed, while color filters of the three primary colors are arranged in a Bayer array in the other pixels which are located in the checkered pattern, and the paired pixels include two pixels which have the color filters of the same color and which are adjacent to each other.

6. An imaging apparatus comprising: the image sensor according to claim 1; and a diaphragm provided in a stage in front of the image sensor; wherein: the imaging apparatus further comprises a control unit which reduces the diaphragm so that an incident angle range of incident light on the image sensor can be limited within a required angle range when a plane image is taken, and which opens the diaphragm so that incident light whose incident angle range is out of the required angle range can be made incident on the image sensor when a 3D image is taken.

7. The imaging apparatus according to claim 6, wherein: the image sensor used in the imaging apparatus has characteristics in which an incident angle θAmax and an incident angle θBmax are expressed by "θIl<θAmax<θIr" and "θrI<θBmax<θrr" respectively when the incident angles θAmax and θBmax provide a maximum light sensitivity to the first pixel and the second pixel respectively, an incident angle range in which a difference between the light sensitivity of the first pixel and the light sensitivity of the second pixel reaches at least 80% of the maximum light sensitivity is "θIl<incident angle<θIr<0", and an incident angle range in which a difference between the light sensitivity of the second pixel and the light sensitivity of the first pixel reaches at least 80% of the maximum light sensitivity is "0<θrI<incident angle<θrr".

8. The imaging apparatus according to claim 7, wherein: the incident angle of the incident light is determined based on an F-number.

9. The imaging apparatus according to claim 8, wherein: when a 3D image is taken, the following relations are satisfied:

$$-\tan^{-1}(1/(2*F\min))<\theta Ir$$

$$\theta rI<\tan^{-1}(1/(2*F\min))$$

where Fmin designates an open value of the F-number.

10. The imaging apparatus according to claim 8, wherein: the following relations are satisfied:

$$-\tan^{-1}(1/(2*F\min))<\theta A\max$$

$$\theta B\max<\tan^{-1}(1/(2*F\min))$$

where Fmin designates an open value of the F-number.

11. The imaging apparatus according to claim 7, wherein: the following relations are satisfied:

$$-\tan^{-1}(1/(2*F\min))<\theta Il$$

$$\theta rr<\tan^{-1}(1/(2*F\min))$$

where Fmin designates an open value of the F-number.

12. The imaging apparatus according to claim 7, wherein: the following relation is satisfied:

$$-\tan^{-1}(1/(2*F\max))<\theta c$$

where Fmax designates a maximum value as a small-diaphragm value of the F-number.

13. The imaging apparatus according to claim 7, wherein an image is taken with the diaphragm on the open side in comparison with F tan(θrI)/2 when a 3D image is taken, and an image is taken with the diaphragm on the small-diaphragm side in comparison with F tan(θc)/2 when a 2D image is taken.

14. The imaging apparatus according to claim 13, wherein: an ND filter is inserted to a stage in front of the image sensor when excess exposure occurs in the case where the diaphragm is opened for taking the 3D image.

* * * * *